United States Patent
Miyahara

(10) Patent No.: US 6,818,574 B2
(45) Date of Patent: Nov. 16, 2004

(54) JOINTED BODY OF GLASS-CERAMIC AND ALUMINUM NITRIDE SINTERED COMPACT AND METHOD FOR PRODUCING THE SAME

(75) Inventor: Kenichiro Miyahara, Fujisawa (JP)

(73) Assignee: Tokuyama Corporation, Yamaguchi (JP)

(*) Notice: Subject to any disclaimer, the term of this patent is extended or adjusted under 35 U.S.C. 154(b) by 25 days.

(21) Appl. No.: 10/149,600
(22) PCT Filed: Dec. 14, 2000
(86) PCT No.: PCT/JP00/08869
§ 371 (c)(1), (2), (4) Date: Jun. 14, 2002
(87) PCT Pub. No.: WO01/44143
PCT Pub. Date: Jun. 21, 2001

(65) Prior Publication Data
US 2002/0193229 A1 Dec. 19, 2002

(30) Foreign Application Priority Data
Dec. 16, 1999 (JP) .......... 11-357786
Dec. 20, 1999 (JP) .......... 11-361513

(51) Int. Cl.[7] .......... C03C 14/00; C03C 10/02
(52) U.S. Cl. .......... 501/32; 510/10
(58) Field of Search .......... 501/32, 10, 18; 428/689, 701, 469; 419/19, 31

(56) References Cited

U.S. PATENT DOCUMENTS

| 4,526,873 A | 7/1985 | Morse et al. |
| 4,714,687 A | 12/1987 | Martin et al. |
| 5,057,376 A | 10/1991 | Takabata et al. |

FOREIGN PATENT DOCUMENTS

| JP | 62-087435 | 4/1987 | |
| JP | 64-079085 | 3/1989 | |
| JP | 6-340443 | 12/1994 | |
| JP | 06-345530 | * 12/1994 | .......... C04B/35/16 |
| JP | 7-015135 | 1/1995 | |
| JP | 7-135379 | 5/1995 | |
| JP | 9-100183 | 4/1997 | |
| JP | 64-079085 | * 3/1999 | .......... C04B/41/86 |
| JP | 2000-159543 | 6/2000 | |
| JP | 3101967 | 8/2000 | |
| JP | 3101971 | 8/2000 | |
| JP | 2001-270788 | * 10/2001 | .......... C04B/41/86 |

OTHER PUBLICATIONS

R.A. Gdula, "Anorthite Ceramic Dielectrics", American Ceramic Society Bulletin, vol. 50, No. 6, pp. 555–557, 1971.

* cited by examiner

Primary Examiner—Deborah Jones
Assistant Examiner—Vivek Koppikar
(74) Attorney, Agent, or Firm—Wenderoth, Lind & Ponack, L.L.P.

(57) ABSTRACT

A compact, low electric resistance and high heat-spreading electric circuit substrate, which is suitable for an electric circuit used at microwave of 1 GHz or more as used in the field of wireless communication such as portable telephones or optical communication, is provided. Also provided is a joined body of glass-ceramic with aluminum nitride sintered body, the glass-ceramic containing crystals having the strongest line in the range of $2\theta=27.6°–28.2°$ in powder X-ray diffraction using $CuK\alpha$ line, e.g., anorthite crystals, and having a composition containing 0.5–30 mass % of Zn component in terms of oxide, not more than 10 mass % in total of Ti component and Zr component in terms of corresponding oxides and not more than 5 mass % of Pb component in terms of oxide. The joined body is prepared by forming a layer of amorphous glass of above composition on an aluminum nitride sintered body, and thereafter heating the composite at temperatures not lower than the softening point of the amorphous glass, e.g., 600–1100° C., and concurrently crystallizing the same by said heating.

27 Claims, 12 Drawing Sheets

JOINTED BODY OF GLASS-CERAMIC AND ALUMINUM NITRIDE SINTERED COMPACT AND METHOD FOR PRODUCING THE SAME

TECHNICAL FIELD

This invention relates to a jointed body of glass-ceramic and aluminum nitride sintered body and method for producing the jointed body.

BACKGROUND ART

Recently, use of microwave of 1 GHz, such as microwave band and quasimillimetric wave band, is increasing in the field of wireless communication, e.g., portable telephones, and optical communication.

As semiconductors operated in such a high-output, high-power consumption Ga—As FET, Si—Ge HBT, CMOS or GaN laser diode and the like are started to be used. Electric circuits on which such semiconductors are to be mounted must meet such requirements as 1) that the circuit pattern material shows small electric resistance, 2) that multi-layered circuit can be formed for size reduction, 3) that the substrate insulation material has a high heat conductivity, high electric insulation and desirably low dielectric constant, and 4) that environmental pollution by circuit substrate material is little.

However, there is no single insulating substrate material meeting all of these conditions. Multi-layered circuit substrate using a highly thermoconductive aluminium nitride sintered body is available, but its electric circuit conductor is made of tungsten/molybdenum type material having high electric resistance and is unsuitable for high-frequency circuits.

A conceivable realistic solution of above problem is a composite circuit substrate in which aluminum nitride sintered body is joined with glass. That is, aluminum nitride sintered body functions to spread the heat from semiconductors, and further in which a part of an electric circuit is formed; a mono-layered or multi-layered glass layer is formed thereon using paste-printing technique or the like: and an electric circuit is formed with Au-, Ag-, or Cu-derived low resistance material on the surface or inside of said glass layer.

A glass material for realizing such a circuit substrate must possess such properties as: 1) high electrical insulation and favorable dielectric characteristics, 2) thermal expansion coefficient close to that of aluminum nitride sintered body, 3) direct jointability with aluminum nitride sintered body, not mediated by an oxide film, 4) inclusion of crystallized phase to enable repeated sintering, and 5) relatively low jointing temperature with aluminum nitride sintered body, which must not be higher than the melting point of the metal component of Au-, Ag- or Cu-metallized material, specifically, not higher than 1100° C., in other words, the operation temperature for softening the glass to achieve sufficiently intimate jointing with aluminum nitride sintered body must not be higher than 1100° C.

As low temperature-softening glass, those containing lead oxide can be produced with relative ease, but lead-containing glass is fundamentally toxic and significantly adversely affects terrestrial environments, although lowering in softening point can be easily achieved therewith. Furthermore, lead-containing glass is apt to have a high thermal expansion coefficient. It also has a defect of readily inducing foaming phenomenon under high temperatures at which it reacts with aluminum nitride sintered body and the reaction gas remains in the glass.

As glass materials for the circuit substrates, those which are described in JP-A-340443/1994 and JP-B-68065/1995 are known. The glass in JP-A-340443/1994 contains a large amount of titanium or zirconium and lead, and the defect of higher thermal expansion coefficient than that of aluminum nitride sintered body, which is $4.5 \times 10^{-6}/°$ C., is not fully removed. The glass also exhibits low joining strength with aluminum nitride substrate. The glass in JP-B-68065/1005 exhibits favorable thermal expansion coefficient and electric insulation, but requires a high temperature treatment at 1100–1500° C. for obtaining satisfactory jointability with aluminum nitride. Therefore, two or more steps are necessary for incorporating an electric circuit therein.

The present invention is made for solving such problems as above-described. I noticed an anorthite ($CaO.Al_2O_3.2SiO_2$) sintered body has, as taught in an article by R. A. Gdula, *American Ceramic Society Bulletin*, 1971, Vol.50, No.6, 555–557, a high electric insulation ($2.8 \times 10^{15}$ $\Omega$.cm: 25° C.), a small dielectric constant (6.2: 1 MHz, 25° C.), a thermal expansion coefficient ($48 \times 10^{-7}/°$ C.: 150° C.–700° C.) which is close to that of aluminum nitride sintered body, and furthermore stability in reducing atmosphere such as of $H_2$, and conducted concentrative studies thereof.

In consequence, I discovered amorphous glass which contains Ca, Si and Al components and hence is expected to be crystallized into anorthite crystals under heating has low melting point in the absence of a large amount of Pb component, exhibits good jointability with aluminum nitride sintered body at relatively low temperatures not higher than 1100° C. and crystallizes under heating to separate a crystal component having a characteristic strongest line in a range of $2\Theta=27.6°–28.2°$ in powder X-ray diffraction using CuK$\alpha$ line. Moreover, I also found that the crystallized glass or glass-ceramic containing said crystal component possessed not only those characteristic properties attributable to said anorthite sintered body but also high thermal stability well withstanding repeated heating for forming a multi-layered glass. (In the following, an amorphous glass having the composition as will form the crystals showing the strongest line in a range of $2\Theta=27.6°$ to 28.2° under heating may occasionally be referred to as "starting glass".

I furthermore found that use of Zn component-containing glass as the starting glass could further lower the crystallization temperature of the crystals having the strongest line in a range of $2\Theta=27.6°$ to 28.2° in powder X-ray diffraction using CuK$\alpha$ line, by 25–100° C. or even more, and could also sharpen the separation pattern of said crystals. It was whereby made possible to prepare a jointed body of glass-ceramic with aluminum nitride sintered body at still lower temperatures, with less occurrence of swelling or residual. carbon in so produced glass-ceramic.

Moreover, I also found that a glass of above-described composition could be sufficiently crystallized, without containing a large amount of Ti or Zr component as nucleating agent and hence the glass-ceramic prepared therefrom could have a thermal expansion coefficient nearly the same to that of aluminum nitride sintered body.

DISCLOSURE OF THE INVENTION

Namely, the present invention provides a jointed body of glass-ceramic consisting of crystalline portion and amorphous portion with aluminum nitride sintered body, which is characterized in that the crystalline portion contains as main crystals a crystal having the strongest line in a range of 2θ=27.6° to 28.2° in powder X-ray diffraction using CuKα line and said glass-ceramic contains 0.5–30% by weight of a Zn component in terms of oxide, not more than 10% by weight of the sum of a Ti component and Zr component in terms of respective oxides and not more than 5% by weight of a Pb component in terms of oxide.

The invention also provides a method for producing a jointed body of glass-ceramic with aluminum nitride sintered body, which method is characterized by forming a glass layer containing an amorphous glass having a composition of 0.5–30% by weight of a Zn component in terms of oxide, not more than 10% by weight of the sum of a Ti component and Zr component in terms of respective oxides and not more than 5% by weight of a Pb component in terms of oxide, on an aluminum nitride sintered body, heating the resulting composite to a temperature not lower than the softening point of said amorphous glass and whereby crystallizing said glass to convert it to a glass-ceramic, the main crystals therein having the strongest line in a range of 2θ=27.6° to 28.2° in powder X-ray diffraction using CuKα line. The present invention also covers an embodiment of the method for producing the jointed body in which, in addition to the glass-ceramic and aluminum nitride sintered body, an electric circuit layer is jointed by heating.

The invention furthermore provides a glass-ceramic composed of amorphous portion and crystalline portion, which can be favorably used in said jointed bodies and the like, said crystalline portion containing as main crystals a crystal having the strongest line in the range of 2θ=27.6° to 28.2° in powder X-ray diffraction using CuKα line, and said glass-ceramic being composed of 8–25% by weight of CaO, 15–35% by weight of $Al_2O_3$, 33–55% by weight of $SiO_2$, 0.05–18% by weight of $B_2O_3$ and 0.5–25% by weight of ZnO.

The glass-ceramic constituting the jointed body of the present invention consists of crystalline portion and amorphous portion.

Compounds consisting solely of crystalline portion have excessively high softening points, and are very difficult to be jointed with aluminum nitride sintered body. Glass-ceramic containing amorphous portion can be jointed with aluminum nitride sintered body at relatively low temperatures, but it is extremely difficult to completely eliminate the amorphous portion by 100% crystallization. On the other hand, glass consisting solely of amorphous portion has a high thermal expansion coefficient and is inferior in electric characteristics and chemical resistance.

Said crystalline portion contains a crystal having the strongest line in a range of 2θ=27.6° to 28.2° in powder X-ray diffraction using CuKα line (which crystal may hereafter be referred to as "A crystal") forming the main crystal phase. A typical example of such a crystal component is, as illustrated by FIG. 1, anorthite crystal ($CaO.Al_2O_3$, $2SiO_2$; $CaAl_2Si_2O_8$) which is identified as Powder Diffraction File No. 20-20 of JCPDS (Joint Committee On Powder Diffraction Standards).

When main crystals separated are those (A crystals) having the strongest line in a range of 2θ=27.6° to 28.2° in powder X-ray diffraction using CuKα line, the following effects can be achieved. That is, anorthite crystal which is a typical A crystal as aforesaid has high electric insulation and small dielectric constant, and hence exhibits excellent electric characteristics as a substrate for electric circuits. Also because its thermal expansion coefficient is close to that of aluminum nitride, that of the glass-ceramic as a whole can also be made of same level with aluminum nitride sintered body with ease. Anorthite crystal is stable under heating in a reducing atmosphere, which renders its repeated heating possible, for forming a multi-stratified glass layer. Moreover, chemical resistance of the glass layer also is drastically improved compared to amorphous glass.

When a Zn component is blended in a starting glass, depending on the heating conditions crystals having the strongest line in a range of 2θ=36.6° to 37.0° in powder X-ray diffraction using CuKα line (which crystal may be hereafter referred to as "B crystal") may be separated, besides A crystals, as the crystalline portion of the glass. A typical example of B crystal is gahnite crystal (ZnO, $Al_2O_3$, $2SiO_2$; $ZnAl_2O_4$) which is identified as Powder Diffraction File No. 5-669 of said JCPDS.

In crystalline portion of the glass-ceramic following the present invention thus A crystals having the strongest line in a range of 2θ=27.6° to 28.2° in powder X-ray diffraction using CuKα line are separated, and B crystals having the strongest line in a range of 2θ=36.6° to 37.0° using powder X-ray diffraction using CuKα line may also be separated. Whereas, according to the present invention A crystals must be the main crystals, because while anorthite crystal which is the representative of A crystal has a thermal expansion coefficient of $4.8×10^{-6}$/° C., a value close to that of aluminum nitride sintered body, gahnite crystal which is the representative of B crystal has a high thermal expansion coefficient of $7.7×10^{-5}$/° C., and where B crystal content is high, it becomes very difficult to make thermal expansion coefficient of the glass-ceramic equivalent to that of aluminum nitride sintered body. Here "main crystals" signifies that the amount of A crystals as determined following the later specified method for measuring crystallization amount is at least 50% by weight, preferably at least 60% by weight, inter alia, at least 70% by weight of the crystalline portion.

Separation of B crystals, on the other hand, is not essential, but preferably B crystals occupy 10–40% by weight, preferably about 10–30% by weight, of the crystalline portion. There is a tendency that the more B crystals, the more A crystals. However, excessively high B crystal content is objectionable because it has a higher thermal expansion coefficient than A crystal.

It is sufficient for the glass-ceramic following the present invention that the total amount of crystals is of the level allowing confirmation by powder X-ray diffraction using CuKα line. Whereas, from the viewpoint of thermal expansion coefficient, electrical characteristics, durability and softening point, total amount of A crystals and B crystals as determined by the later specified measurement method of crystallization is preferably 1–90% by weight; in particular, 3–85% by weight, inter alia, 30–80% by weight. The best result can be obtained when it is 40–70% by weight. Glass of high crystal content tends to require high temperatures for its production or fail to give sufficient jointing strength with aluminum nitride sintered body. On the other hand, there is seen a tendency that the less the crystal content, the higher the thermal expansion coefficient and the lower the electrical characteristics, chemical resistance, durability, etc.

It is preferred that the total crystalline portion is 30–80% by weight, of which 60–90% by weight being A crystals and 10–40% by weight being B crystals. Even better is that the total crystalline portion is 40–70% by weight, of which 70–90% by weight being A crystals and 10–30% by weight being B crystals.

So long as the effects of the present invention are not impaired, crystal(s) other than one having the strongest line in the ranges of 2θ=27.6° to 28.2° and 2θ=36.6° to 37.0° in powder X-ray diffraction using CuKα line, may be separated.

The respective amounts of A crystals and B crystals in a glass-ceramic following the present invention can be determined by the following method, which is explained referring to anorthite, a typical example of A crystal, and gahnite, a typical example of B crystal.

First, the end point of crystallization is ascertained by means of powder X-ray diffraction and differential thermal analysis. Where an amorphous glass is heated to be crystallized, until the condition is reached at which the crystallization no more progresses even under higher temperatures or longer hours' heating. That condition is specified as the one at which the maximum anorthite and gahnite contents are attained. The intensity ratio between the strongest lines of anorthite and gahnite in powder X-ray diffraction (when CuKα line is used, the strongest line of anorthite appears in the range of 27.6° to 28.2°, and that of gahnite, in the range of 36.6° to 37.0°) is recorded as the molar ratio of anorthite crystal to gahnite crystal (the molar ratio is hereafter called R). Then, of the components contained in the glass-ceramic of the present invention, $Al_2O_3$ which is a constituent of both anorthite crystal and gahnite crystal is distributed to said two according to R. Where no gahnite crystal is present, it is unnecessary to distribute the $Al_2O_3$, but all is calculated as anorthite crystal component.

Then the maximum amount of crystallization in the glass-ceramic is calculated. For calculating the maximum amount of anorthite, the least component among those constituting anorthite, i.e., CaO, $Al_2O_3$ and $SiO_2$, in terms of molar ratio is taken as the standard, under a presumption that all of the least content component is consumed for crystallization of anorthite and the remaining two components are consumed at a molar ratio of CaO: $Al_2O_3$:$SiO_2$=1:1:2 to form anorthite crystals, and the total amount of CaO, $Al_2O_3$ and $SiO_2$ at this time is the maximum amount of separated anorthite crystals as referred to in the present invention. According to the present invention, furthermore, the Al component is calculated by a unit of $Al_2O_3$, and the $Al_2O_3$ content used in the above calculation is same as the calculated amount as distributed to anorthite according to R as above-specified.

On the other hand, calculation of the maximum amount of gahnite crystals is based on the less component between those constituting gahnite, i.e., ZnO and $Al_2O_3$, in terms of molar ratio, under a presumption that all of the least content component is consumed for crystallization of gahnite and that the other component is consumed at a molar ratio of ZnO:$Al_2O_3$=1:1 to form gahnite crystals. The total amount of ZnO and $Al_2O_3$ at this time is the maximum amount of gahnite crystals as referred to in the present invention. The $Al_2O_3$ content used in this calculation is the same to that which is distributed to gahnite crystals according to R as above-specified.

For example, taking a case of a glass containing CaO: 15 wt % (2.68 mmol/g), $Al_2O_3$: 24 wt % (2.35 mmol/g), $SiO_2$: 42 wt % (7.00 mmol/g), $B_2O_3$: 8 wt % (1.14 mmol/g) and ZnO: 11 wt % (1.36 mmol/g), its crystallization from amorphous condition is deemed to be completed by heating at 900° C. The ratio (R) of anorthite to gahnite in the glass-ceramic after said heating at 900° C. is 0.3769.

Then the $Al_2O_3$ content of 24 wt % (2.35 mmol/g) is distributed according to R=0.3769, i.e., 17.43 wt % (1.71 mmol/g) to anorthite crystals and 6.57 wt % (0.64 mmol/g) to gahnite crystals.

The glass composition capable of separating anorthite crystals is CaO: 15 wt % (2.68 mmol/g), $Al_2O_3$: 17.43 wt % (1.71 mmol/g) and $SiO_2$: 42 wt % (7.00 mmol/g), and therefore the maximum amount of anorthite crystals is calculated following the content of $Al_2O_3$, the least component, to be the sum of CaO: 9.58 wt %, $Al_2O_3$: 17.43 wt % and $SiO_2$: 20.54 wt %, which equals 47.55 wt %.

Because ZnO: 11 wt % (1.36 mmol/g) and $Al_2O_3$: 6.57 wt % (0.64 mmol/g), the sum of ZnO: 5.24 wt % (0.64 mmol/g) and $Al_2O_3$: 6.57 w % (0.64 mmol/g) which equals 11.81 wt % is the maximum amount of gahnite crystals.

Hence, the maximum crystal content in this glass-ceramic, anorthite crystals and gahnite crystals, as combined is 59.36 wt %.

The remaining CaO: 5.42 wt %, $SiO_2$: 21.46 wt %, ZnO: 5.76 wt % and $B_2O_3$: 8 wt % are calculated to form amorphous glass matrix.

A crystal content in a glass-ceramic can be calculated from the maximum crystal content as calculated by the above method, X-ray diffraction intensity and measured X-ray diffraction intensity.

For example, starting from a starting glass composed of above components and which is in amorphous condition, its heating temperature is continuously raised until its anorthite and gahnite crystal contents reached the maximum. At that time the powder X-ray diffraction intensity (count number) indicated by the strongest line inherent in anorthite crystal is 1170, and that (count number) indicated by the strongest line inherent in gahnite crystal is 441.

Where said X-ray diffraction intensity (count number) of the starting glass under heating, in which anorthite crystals alone are separated, is 55, the anorthite crystal content of the glass under heating is calculated to be 2.24 wt % (47.55× 55/1170=2.24).

When gahnite crystals also start to be separated under further heating and X-ray diffraction intensity (count number) of the gahnite crystals is 90, the gahnite crystal content in the glass-ceramic under said condition is calculated to be 2.41 wt % (11.81×90/441). If the X-ray diffraction intensity of anorthite crystals in the glass containing 2.41 wt % of gahnite crystals and being heated is 1116, the anorthite crystal content of the glass-ceramic is calculated to be 45.36 wt %, and the crystal content, which is the sum of said anorthite crystals and gahnite crystals, of the glass-ceramic is 47.77 wt %.

In the aforesaid glass under heating in which anorthite crystals alone are separated in an amount of 2.24 wt %, its crystalline portion consists of CaO: 0.45 wt %, $Al_2O_3$: 0.82 wt % and $SiO_2$: 0.97 wt %. The composition of the amorphous portion is: CaO: 14.55 wt %, $Al_2O_3$: 23.18 wt %, $SiO_2$: 41.04 wt %, $B_2O_3$: 8 wt % and ZnO: 11 wt %.

Also in the glass wherein 45.36 wt % of anorthite crystals and 2.41 wt % of gahnite crystals are separated, the anorthite crystal portion consists of CaO: 9.14 wt %, $Al_2O_3$: 16.62 wt % and $SiO_2$: 19.59 wt %; and the gahnite crystal portion consists of $Al_2O_3$: 1.34 wt % and ZnO: 1.07 wt %. The amorphous portion contains CaO: 5.86 wt %, $Al_2O_3$: 6.04 wt %, $SiO_2$: 22.41 wt %, $B_2O_3$: 8 wt % and ZnO: 9.93 wt %.

Where A crystal and B crystal are other than anorthite and gahnite, respectively, their compositions can be determined in a manner similar to the above-described method.

Glass-ceramic containing anorthite crystals, which is to be used in the present invention, normally contains Ca, Al and Si. These components are considered to be crystallized as anorthite crystals to show the strongest line appearing in powder X-ray diffraction using CuKα line in the range of 2θ=27.6°–28.2°. These components may also be present in the amorphous portion.

Ca component is preferably contained in glass-ceramic in an amount as converted to CaO of 5–25 wt %, in particular, 8–25 wt %. Where the Ca content is too low, it becomes difficult to separate crystals which are inferred to be anorthite crystals in glass-ceramic. On the other hand, when the amount is excessive, jointability of the glass-ceramic with aluminum nitride sintered body is impaired, e.g., cracks are formed during the jointing operation.

Preferred Al component content in terms of $Al_2O_3$ is 15–40 wt %, in particular, 15–35 wt %. Where the Al component content is too low, anorthite crystals are difficult to be separated, but when it is too much, there observed a tendency that high temperatures are required for jointing with an aluminum nitride sintered body.

Too low a Si component content also renders it difficult to separate anorthite crystals. Conversely, when it is too high, higher temperatures tend to be required for jointing the glass-ceramic with aluminum nitride sintered body. Si component content is preferably 25–60 wt % in terms of $SiO_2$, in particular, 33–55 wt %.

It is important that glass-ceramic according to the present invention contains Zn component. By incorporating a Zn component, it becomes possible to lower the crystallization temperature of A crystals which have the strongest line in powder X-ray diffraction using CuKα line in the range of 27.6°–28.2°, by 25–100° C. compared to the case where no Zn component is incorporated. Furthermore, the incorporation sharpens crystallization pattern of said crystals, and hence can prevent occurrence of residual carbon or swelling in formed glass-ceramic.

In occasions said Zn component may separate as, for example, gahnite crystals. In consequence, excessive Zn component causes crystallization of greatest part of Al component as B crystals, e.g., gahnite crystals, although consumption of the Al component for A crystals is preferred. Therefore, Zn component content in terms of ZnO is preferably 0.5–30 wt %, in particular, 0.5–25 wt %. ZnO can also be present in the amorphous portion.

Glass-ceramic according to the present invention preferably contains a boron (B) component as incorporated therein, to have a lowered softening point and improved jointability with aluminum nitride sintered body which is described later. Whereas, when a large amount of boron (B) component is contained, detrimental effects may be brought, such as increase in hygroscopicity and reduction in chemical resistance, and preferably the content in terms of $B_2O_3$ is in a range of 0.05–20 wt %, in particular, 0.05–18 wt %. $B_2O_3$ is present in amorphous portion of glass-ceramic.

It is a general practice to blend a Ti and/or Zr component as a crystallization or nucreating agent, for crystallization of crystallizable component(s) in glass-ceramic. Ti and/or Zr component, however, increases thermal expansion coefficient of glass-ceramic, and its or their blending in a large amount is undesirable. Furthermore, when these components are contained in large amounts, they may cause separation of $CaO.TiO_2.SiO_2$ crystals, $CaO.ZrO_2.2TiO_2.SiO_2$ cryastals or $ZrO_2.SiO_2$ crystals to interfere with separation of the crystals having an inherent strongest line in powder X-ray diffraction using CuKα line in the range of 2θ=27.6°–28.2°. According to my studies, by inclusion of above-listed CaO, $Al_2O_3$, $SiO_2$, ZnO and $B_2O_3$ as the constituent components, it becomes possible to separate a sufficient amount of crystals in the glass-ceramic, in the complete absence of Ti and/or Zr component. For approximating thermal expansion coefficients of glass-ceramic and aluminum nitride sintered body, it is necessary to keep blended amount of Ti and/or Zr component not higher than 10 wt % in terms of oxide(s), in particular, not higher than 5 wt % in total, inter alia, substantially zero.

According to the invention, the glass-ceramic is jointed with aluminum nitride sintered body. Generally a Pb component is blended in the glass to lower softening point of glass and facilitate its jointing with ceramics. Pb, however, reacts with aluminum nitride at high temperatures to evolve a gas, whereby causing swelling or the like in glass-ceramic. Therefore, less Pb component contained in the glass is preferred. More specifically, it must be no more than 5 wt % in terms of oxide thereof. It is preferred that substantially no Pb component is present in the glass.

It is permissible for the glass-ceramic according to the present invention to contain, besides those components so far described, another component or other components for the purpose of lowering softening point of the glass or improving its jointability or adherability to aluminum nitride sintered body. As examples of such additional components, alkalu metals (Li, Na, K) or alkaline earth metals (Mg, Sr, Ba) may be named. When these components are blended in large amounts, however, deterioration in electrical properties (for example, dielectric constant or electric resistance), reduction in chemical resistance or increase in thermal expansion coefficient result.

Again, so long as the effects of the present invention are not impaired, other oxide component(s) may be blended.

It is preferred that the content of such component(s) other than CaO, $Al_2O_3$, $SiO_2$, ZnO, $B_2O_3$, PbO, $TiO_2$, $ZrO_2$ is not more than 7 wt % in terms of corresponding oxides. In particular, alkali metal component is preferably not more than 2 wt %, and alkaline earth metal component, not more than 5 wt %, both in terms of their respective oxides. It is more convenient that the sum of an alkali metal component and alkaline earth metal component be not more than 5 wt %, even still better is that the glass is substantially free of these components. Absence of these components creates no problem.

Glass-ceramic according to the invention may further contain a fluorine component which cannot be converted to an oxide, within a range not interfering with the effects of the invention.

Considering the balance among such factors as ready availability of starting materials and ease of production which are discussed later; electric characteristics such as electrical resistance, dielectric constant; jointability with aluminum nitride sintered body which also is observed later; ready coincidence in thermal expansion coefficients between the glass-ceramic and said sintered body; thermal resistance and chemical resistance; preferred composition of the glass-ceramic according to the present invention is as follows, in which all weight percents are in terms of respective oxides: CaO: 5–25 wt %, $Al_2O_3$: 15–40 wt %, $SiO_2$: 25–60 wt %, $B_2O_3$: 0.05–20 wt %, ZnO: 0.5–30 wt %, $TiO_2+ZrO_2$: 0–5 wt %, PbO: 0–5 wt %, and other metal oxide(s): 0–7 wt %, (the total of these components being 100 wt %); in particular, CaO: 8–25 wt %, $Al_2O_3$: 15–35 wt %, $SiO_2$: 33–55 wt %, $B_2O_3$: 0.05–18 wt % and ZnO: 0.5–25 wt % (the total of these components being 100 wt %). Furthermore, in the optimum composition, ZnO is 3–18 wt %.

The glass-ceramic of the present invention, which contains the crystals having the strongest line in powder X-ray diffraction using CuKα line in the range of 2θ=27.6°–28.2° has electrical characteristics of high electrical resistance and small dielectric constant, i.e., normally an electric resistance of at least $1 \times 10^{12}$ Ω.cm and a dielectric constant not higher than 8 at 1 GHz. As stated later, to allow an electric circuit which is formed on glass-ceramic or aluminum nitride sintered body fully exhibits its characteristics, the glass-ceramic preferably has an electrical resistance of at least $1 \times 10^{13}$ Ω.cm, in particular, at least $1 \times 10^{14}$ Ω.cm. Also its dielectric constant is preferably not more than 7.5 at 1 GHz, in particular, not more than 7. Particularly suitable glass-ceramic for the jointed body of the present invention has an electrical resistance of at least $1 \times 10^{14}$ Ω.cm and a dielectric constant of not more than 7 at 1 Ghz.

Glass-ceramic of the present invention can be prepared by a method known per se. More specifically, it can be prepared by preparing an amorphous glass of a composition capable of being crystallized to separate the crystals having the strongest line in the range of 2θ=27.6°–28.2° in powder X-ray diffraction using CuKα line under heating and heating the same to a prescribed temperature to crystallize the glass.

The amorphous glass has a softening point and crystallization temperature preferably not higher than 1100° C., in particular, not higher than 1050° C., inter alia, not higher than 970° C. It is still the best that said point and temperature are not higher than 900° C.

Such an amorphous glass can be prepared by once fusing the starting materials which are formulated to give an above-described chemical composition, and thereafter rendering it amorphous by such means as quenching to provide a glass.

As the starting materials to be used in the above production method of said amorphous glass, oxides corresponding to the intended composition of the glass can be named. Those oxides are not limited to simple oxides but complex oxides may also be used. Again as the starting materials useful in the above production method, carbonates and hydroxides can also be suitably used besides oxides. Furthermore, halides such as fluorides, chlorides and the like; inorganic salts such as nitrates and sulfates; organic acid salts such as oxalates and citrates; organometal compounds such as metal alkoxides; and hydrates of the foregoing can also be used.

Specific examples of those compounds other than oxides include $CaCO_3$, $Ca(OH)_2$, calcium acetate, $CaCl_2$, $CaF_2$, $Al(OH)_3$, $AlCl_3$, $AlF_3$, magnesium carbonate, magnesium acetate, $MgCl_2$, $MgF_2$, $H_3BO_3$, tetraethyl silicate and the like. As $SiO_2$, natural product such as silica sand may also be used.

Describing the above production method in further details, those starting compounds are weighed to provide an intended composition in terms of oxides and mixed, and fused at around 1200–1700° C. The fused composition is quenched and vitrified by such means as flowing over a water-cooled metal plate. This glass can be confirmed to be amorphous by X-ray diffration analysis. The X-ray diffraction chart of the glass is broad in the range of 2θ=18°–35° when CuKα line is used, showing a pattern having a broad peak in the vicinity of 25° (FIG. 2).

This amorphous glass is crystallized under suitable heating conditions to separate crystals having the strongest line in a range of 2θ=27.6°–28.2° in powder X-ray diffraction using CuKα line (A crystals) (FIGS. 4 and 5). Depending on selected composition and heating conditions, in addition to A crystals, crystals having the strongest line in a range of 2θ=36.6°–37.0° in powder X-ray diffraction using CuKα line (B crystals) are separated (FIGS. 6–9).

A jointed body according to the present invention is formed by jointing above-described glass-ceramic with aluminum nitride sintered body.

As aluminum nitride sintered body which is used for the jointed body of the present invention, any known sintered bodies can be used without any limitation, so long as their main component has a composition of AlN. As components other than AlN, for example, $Y_2O_3$, $Yb_2O_3$, $Er_2O_3$, $Ho_2O_3$ and compounds of rare earth elements containing Sc, Y, Er, Yb, Dy, Ho, Gd, La and the like; and alkaline earth metal compounds such as CaO and SrO, can be used as sintering promotor; an alkali metal like $Li_2O$ or silicon compound such as $SiO_2$, $Si_3N_4$ or SiC can be used for lowering sintering temperature; and further metals such as Mo, W, V, Nb, Ta, Ti and the like or compounds of those metals or carbon-containing compounds may be used for blackening the formed sintered bodies.

Aluminum nitride sintered body may have an as-sintered surface or the surface may be given various treatments such as washing, honing, grinding or mirror-finishing, among which one meeting the purpose of use can be selected for individual occasion.

Taking into consideration such factors as heat conductivity, chemical resistance, thermal expansion coefficient, electrical characteristics, optical characteristics and ease of production of sintered body, use of AlN sintered body substantially free of other components, or AlN sintered body containing 0.1–15 wt % of Y or Er compound in terms of the respective oxides ($Y_2O_3$, $Er_2O_3$) is preferred. In particular, use of AlN sintered body containing 0.5–10 wt % in terms of corresponding oxide of Y or Er compound is preferred.

Production method of a jointed body of the present invention in which glass-ceramic is joined with aluminum nitride sintered body may be any, but the following method is particularly preferred.

That is, the method comprises forming a glass layer containing an amorphous glass (the starting glass) having a composition capable of being crystallized under heating to separate the earlier described crystals having the strongest line in a range of 2θ=27.6°–28.2° in powder X-ray diffraction using CuKα line, on an aluminum nitride sintered body, and heating the resultant composite to a temperature not lower than the softening point of the starting glass, whereby jointing the glass with the aluminum nitride sintered body. While it is possible to crystallize to separate the crystals having the strongest line in a range of 2θ=27.6°–28.2° in powder X-ray diffraction using CuKα line by a heating separately from the heating to effect the jointing, said simultaneous crystallization under the heating for the jointing is more advantageous for process design and is preferred. Namely, in the occasion of heating an aluminum nitride sintered body on which the starting glass layer is formed, by that single heating the jointed body of glass-ceramic and aluminum nitride sintered body can be produced by using a heating temperature not lower than the softening point of the starting glass and also not lower than the crystallization temperature of the glass to separate crystals having the strongest line in the range of 2θ=27.6°–28.2° in powder X-ray diffraction using CuKα line.

Such a heating temperature differs depending on individual starting glass composition, but 600–1100° C., in particular, 800–1050° C., are preferred. It is still more convenient that a temperature within a range of 800–970° C. is used, inter alia, 800–900° C. Where the heating temperature is too low, the jointing or the crystallization tend to become insufficient. Conversely, heating at too high a temperature tends to increase the crystal amount but at the same time, is disadvantageous in energy consumption. Furthermore, in the occasion of forming an electric circuit layer as later described, such metals as Au, Ag, Cu and the like which constitute said electric circuit layer are fused under such high temperature, and formation of adequate circuit pattern becomes difficult.

Where the glass layer is formed of a multi-layered construction or a separate heating is conducted in the later described occasion of electric circuit formation, i.e., when heating is conducted plural times, crystallization does not necessarily occure at the first heating only for jointing an aluminum nitride sintered body with the glass, but it can progress during the subsequent heating(s).

It should be understood that the method of producing a jointed body of the present invention is not limited to the above, but if necessary such a method comprising using as the starting glass a partially crystallized glass and further advancing the crystallization under the heating for softening and joining; or a method comprising repeating glass paste application, heating and softening cycle plural times and conducting a last heating for crystallization, may also be used.

Extent of crystallization can be confirmed by means of powder X-ray diffraction using CuKα line as aforesaid. According to the invention, crystals having the strongest line in a range of $2\theta=27.6°–28.2°$ are separated. Also another kind of crystals having the strongest line in a range of $2\theta=36.6°–37.0°$ are also separated, said crystal having the strongest line characteristic thereof at $2\theta=36.6°–37.0°$ also shows a second highest intensity line in a range of $2\theta=31.0°–31.4°$, as the crystallization progresses.

For forming said starting glass layer on an aluminum nitride sintered body, any method known per se can be used.

Specifically, a method comprising pulverizing the starting glass, mixing it with an organic binder and solvent to form a paste, applying the paste onto an aluminum nitride sintered body surface by such means as screen printing, and heating the same to volatilize the organic components is preferred.

In the occasion of forming the starting glass into a paste, average particle size of the glass powder is preferably 0.1–20 μm, in particular, 0.3–10 μm, inter alia, 0.5–6 μm, from the viewpoint of easy paste production and favorable leveling property of the glass surface formed after the sintering for joining with aluminum nitride sintered body.

For the purpose of approximating thermal expansion coefficients of glass-ceramic and aluminum nitride sintered body and of lowering dielectric constant or improving binder removing efficiency of the glass, it is effective to add a ceramic powder such as of $Al_2O_3$, $SiO_2$, $Si_3N_4$, SiC, AlN, mullite, spinel, cordierite and the like to the starting glass paste as a filler. It is also permissible to add pigment which contains a transition metal such as iron, cobalt, nickel or chromium, in an amount of a range not detrimental to the characteristic properties of the glass, for example, not more than 5 wt % of a transition metal as converted to its oxide, to color the glass green, blue or brown. Generally spinel type pigments are preferred.

The joining or bonding strength between glass-ceramic and aluminum nitride sintered body in a jointed body of the present invention preferably is at least 25 Mpa, in particular, at least 35 Mpa, inter alia, at least 50 Mpa, as measured by 90° C. perpendicular tensile test, from the standpoint of reliability and durability when the body is used as a part of various devices.

In a jointed body of the present invention, an electric circuit is preferably formed on the surface or inside of the glass-ceramic. It is permissible that an electric circuit may be formed on the surface of the aluminum nitride sintered body.

As an electric circuit, any of known products containing conductors, resistor materials, dielectric materials and the like can be used without any limitation. Methods of its formation again may be those known ones.

For forming an electric circuit, low-resistance and low-melting point metals, e.g., Au, Ag and Cu; high-melting point metals, e.g., tungsten and molybdenum; and other various metal materials such as platinum group, nickel, chromium, cobalt, titanium, zirconium, tantalum, niobium and their alloys; nitrides, carbides and silicates of those metals are used. Of those various materials, low-resistance materials such as Au, Ag, Cu and the like are most widely used. In order to avoide fusion of these metallic components, it is desirable that they are not heated at temperatures higher than 1100° C., in particular, higher than 1050° C., at the time of the circuit formation.

As methods for forming electric circuit, known methods such as screen printing using a metallic paste, electrolytic or non-electrolytic plating or thin film forming by means of sputtering or vapor deposition can be used.

When an electric circuit is to be formed on surface of the aluminum nitride sintered body, a circuit or circuits can be formed on one surface or plural surfaces (e.g., two surfaces facing with each other) of aluminum nitride sintered body, in advance of producing a jointed body of glass-ceramic with aluminum nitride sintered body. In that case, the glass-ceramic may be joined in any manner as will or will not cover the electric circuit on the aluminum nitride sintered body surface, or will cover only a part of the electric circuit. Furthermore, the glass-ceramic can be joined in such a manner as will cover one surface only of the aluminum nitride sintered body, or cover plural surfaces of the body. In the latter case, it is one of favorable embodiments to form electric circuits on plural surfaces of an aluminum nitride sintered body, and to cover some of the circuits with glass-ceramic, leaving the remaining circuits uncovered. It is also possible to so effect the joining as will cover only a part, not the entiety, of any one surface.

Glass-ceramic may also be joined not in contact with an electric circuit in the occasion of soldering surfaces of the material constituting an electric circuit for preventing corrosion of said material, with the view to prevent fused solder from flowing into the parts not requiring soldering.

When an electric circuit is to be formed on the glass-ceramic surface, it can be performed in the manner similar to above-described methods for forming an electric circuit or circuits on aluminum nitride sintered body surface. As a method for forming an electric circuit inside of the glass-ceramic, the one comprising first forming a layer of a substance capable of forming an electric circuit under heating on the surface of the starting glass, heating the laminate to convert it to a glass-ceramic with a surface on which an electric circuit layer is formed, then further forming a glass layer on said electric circuit layer to cover the latter, heating the whole once again to integrate the glass, and repeating the above-described procedures. It is preferred for thus prepared glass laminate to be so well integrated that the jointed portions are fused and visually indistinguishable. In certain cases, however, the integration is incomplete, allowing confirmation of each glass layer and junctions therebetween. This invention also encompasses such an embodiment.

In the occasion of laminating glass at multiple stages, glasses of different compositions may be used for individual layers. For example, for the layer contacting with aluminum nitride sintered body, a glass exhibiting high jointability and having a low softening point can be used, while for the layer contacting the atmospheric air, a glass of high chemical resistance can be used. Furthermore, within an extent not impairing the effects of the present invention, a glass not containing the crystal having the strongest line in the range of $2\theta=27.6°–28.2°$ in powder X-ray diffraction using CuKα line can be concurrently used. An example of such a case is illustrated as over-glass 4 in later discussed FIG. 20.

Among these methods for forming electric circuit, furthermore, a preferred embodiment comprises applying a known conductive metallic paste onto an aluminum nitride sintered body surface and/or onto a glass layer formed of a glass paste which contains the amorphous starting glass, by such means as screen printing, and heating the laminate at 800–970° C. to simultaneously effect conversion of the amorphous glass paste to glass-ceramic, joining the glass-ceramic with the aluminum nitride sintered body, and conversion of the conductive paste to an electric circuit.

In the above-described case of adopting multi-layered electric circuits and glass-ceramic construction, the glass-ceramic functions as an insulation layer between every two electric circuits. Thickness of the glass-ceramic layer serving as an insulation layer is preferably 1–300 μm, in particular, 3–100 μm, inter alia 5–70 μm, per layer, for assuring good electrical insulation and facilitating formation of via hole(s) electrically connecting electric circuit layers and formation of uniform thickness.

The present invention also provides a method as above-described, which forms glass.ceramic, aluminum nitride sintered body and electric circuit(s) by heating.

In this case, the starting amorphous glass to be converted to glass-ceramic does not necessarily contain Zn component, it being sufficient for obtaining the effects of the invention that it is capable of separating under heating a crystal having the strongest line in the range of $2\theta=27.6°–28.2°$ in powder X-ray diffraction using CuKα 1 and is substantially amorphous, containing in total not more than 10 wt % of Ti component and Zr component in terms of respective oxides, and not more than 5 wt % of Pb component in terms of its oxide. Needless to say, the amorphous glass preferably contains 0.5–30 wt % of Zn component, so that the heating temperature for the jointed body production can be lowered.

In a preferred embodiment of the jointed body according to the invention, which is formed of glass-ceramic and aluminum nitride sintered body, the glass-ceramic contains 30–80 wt % of crystalline portion, 60–90 wt % of said crystalline portion being the crystals having the strongest line in a range of $2\theta=27.6°–28.2°$ in powder X-ray diffraction using CuKα line, and 10–40 wt % of said crystalline portion being the crystals having the strongest line in the range of $2\theta=36.6°–37.0°$ in powder X-ray diffraction using CuKα line; said glass-ceramic has a composition composed of CaO: 8–25 wt %, $Al_2O_3$: 15–35 wt %, $SiO_2$: 33–55 wt %, ZnO: 0.5–25 wt % and $B_2O_3$: 0.05–18 wt %, being a CaO—$Al_2O_3$—$SiO_2$—$B_2O_3$—ZnO glass-ceramic substantially free of other component; an average jointing strength at the glass-ceramic-aluminum nitride sintered body interface, as measured by 90° perpendicular tensile test, is at least 35 MPa; and electric circuits are formed in multi-layers on the surface and/or inside of the glass-ceramic.

A particularly preferred embodiment is a jointed body in which the crystalline portion of the glass-ceramic is 40–70 wt % wherein anorthite crystals occupying 70–90 wt % and gahnite crystals occupying 10–30 wt %; the glass-ceramic has an electric resistance of at least $1\times10^{14}$ Ω.cm and dielectric constant not higher than 7 at 1 GHz; the average jointing strength of the glass-ceramic and aluminum nitride sintered body at their interface, as measured by 90° perpendicular tensile test is at least 50 MPa; and electric circuits are formed in multi-layers on the surface and/or inside of the glass-ceramic.

FIG. 20 shows an example of a circuit substrate. Referring to FIG. 20, a three layered glass-ceramic 1 is formed on an aluminum nitride sintered substrate 2. At inside and on surface of the glass-ceramic and on surfaces of the aluminum nitride sintered substrate, wiring conductors 3 are formed. For these wiring conductors, low resistance material made chiefly of Cu, Ag and Au is useful. Besides, cover glass 4 for protecting the wiring conductors and via 6 for conductivity are formed. This circuit substrate carries semiconductor chip 5 and chip parts 7 such as resistor and capacitor.

Jointed bodies of the present invention are not limited to the one illustrated on FIG. 20. For example, the glass layer may be formed of one, two, or four or more layers. Also semiconductor chip mounting is preferably conducted directly on aluminum nitride sintered sabstrate without a glass layer intervening, as shown on FIG. 20 for better heat spreading, while it is possible to mount it through a thin glass layer where circuit design requires it. The thickness of the glass layer in such an occasion is preferably not more than 100 μm. The semiconductor chip can be mounted not on the glass layer side as shown in FIG. 20, but on the opposite side.

In the present invention, the glass-ceramic containing a crystal having the strongest line in the range of $2\theta=27.6°–28.2°$ in powder X-ray diffraction using CuKα line exhibits, besides chemical resistance, excellent oxidation resistance, plasma etching resistance and the like, and upon being joined with aluminum nitride sintered body, prevents the body from direct exposure to severe environments and contributes to improvements in chemical resistance (in particular, alkali resistance or corrosion resistance by molten salts), oxidation resistance (in particular, corrosion resistance in an oxidizing atmosphere at high temperatures not lower than 600° C.) and plasma etching resistance (in particular, resistance of semiconductor production apparatus to corrosion by plasma gas containing corrosive elements such as chlorine and fluorine) of the aluminum nitride sintered body. Jointed bodies of glass-ceramic and aluminum nitride sintered body according to the present invention, therefore, are applicable not only to above circuit substrate but also to mechanical parts or high temperature structural material for heater or the like or tooling for semiconductor-producing apparatus.

EXAMPLES AND REFERENTIAL EXAMPLES

Hereinafter the present invention is explained more specifically, referring to working examples, it being understood that the present invention is not limited to these examples.

Example 1

Figure 2:
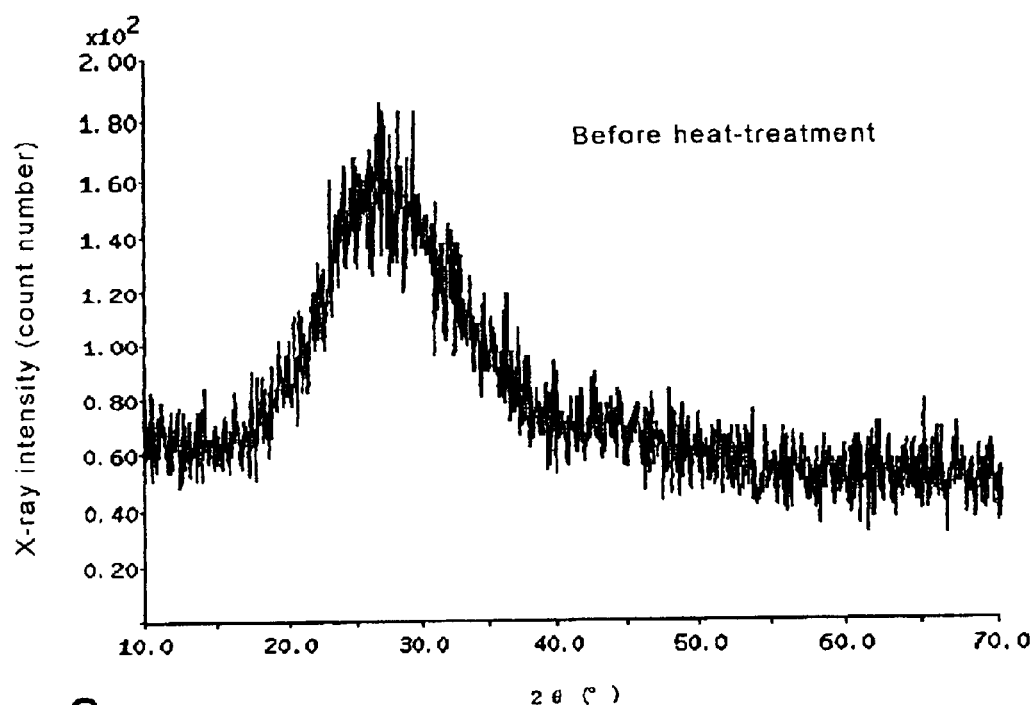
FIG. 2 is a powder X-ray diffraction chart of CaO—$Al_2O_3$—$SiO_2$—$B_2O_3$—ZnO amorphous glass which was obtained in Example 1.

Starting materials were mixed in a ball mill by dry system, to give 60 g of a starting blend consisting of CaO: 15 wt %, $Al_2O_3$: 24 wt %, $SiO_2$: 42 wt %, $B_2O_3$: 8 wt % and ZnO: 11 wt %. This blend was placed in a platinum crucible and fused at 1600° C. The starting materials used were oxide powders, excepting that $CaCO_3$ powder was used as the CaO source. The fusion fluid was let flow on water-cooled stainless steel plate and quenched to provide a glass. Upon examining by powder X-ray diffraction, this glass was found amorphous. Its diffraction chart is shown as FIG. 2.

Figure 3:
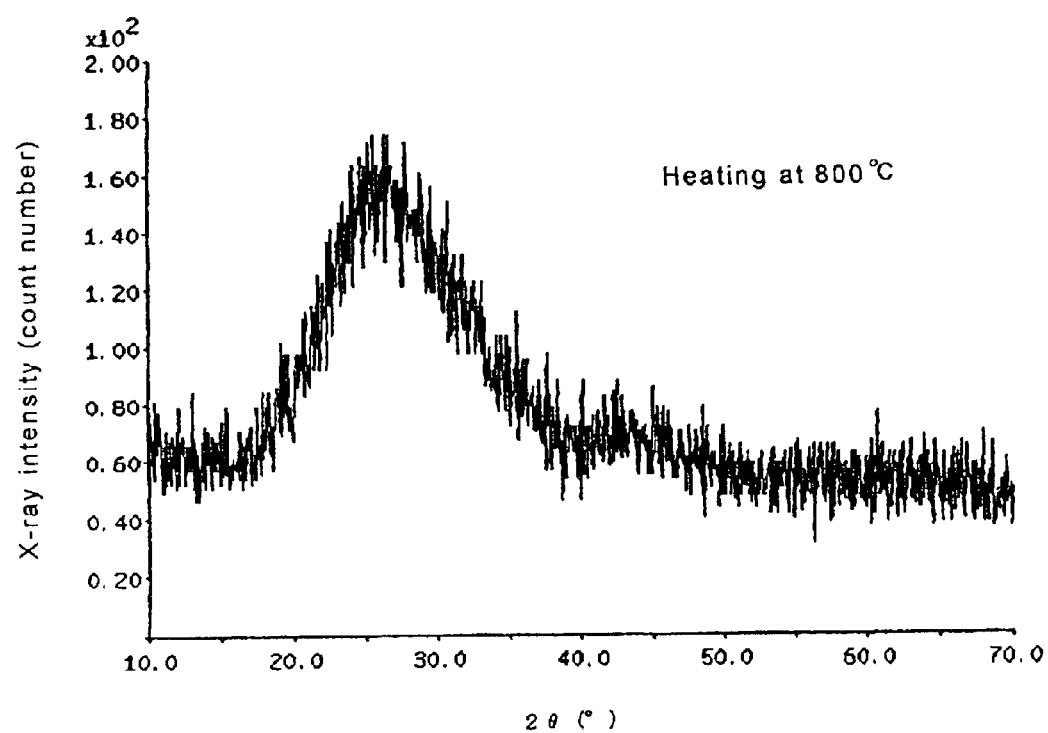
FIG. 3 is a powder X-ray diffraction chart of the glass obtained by heating CaO—$Al_2O_3$—$SiO_2$—$B_2O_3$—ZnO amorphous glass at 800° C. for 20 minutes in Example 1.
Figure 4:
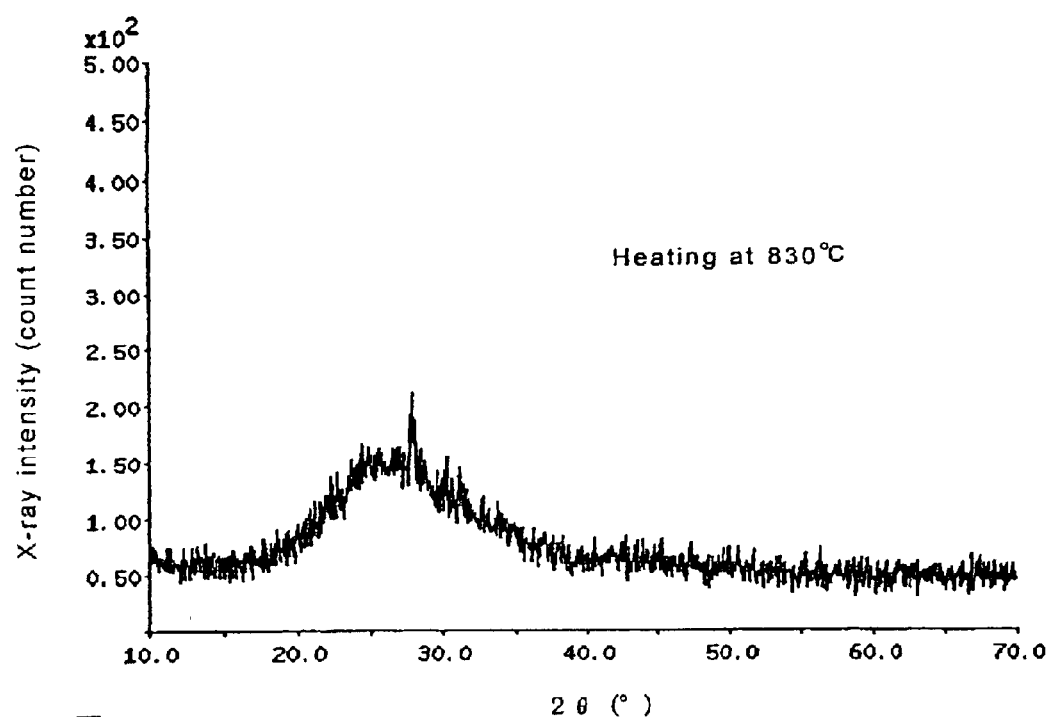
FIG. 4 is a powder X-ray diffraction chart of the glass obtained by heating CaO—$Al_2O_3$—$SiO_2$—$B_2O_3$—ZnO amorphous glass at 830° C. for 20 minutes in Example 1.
Figure 5:
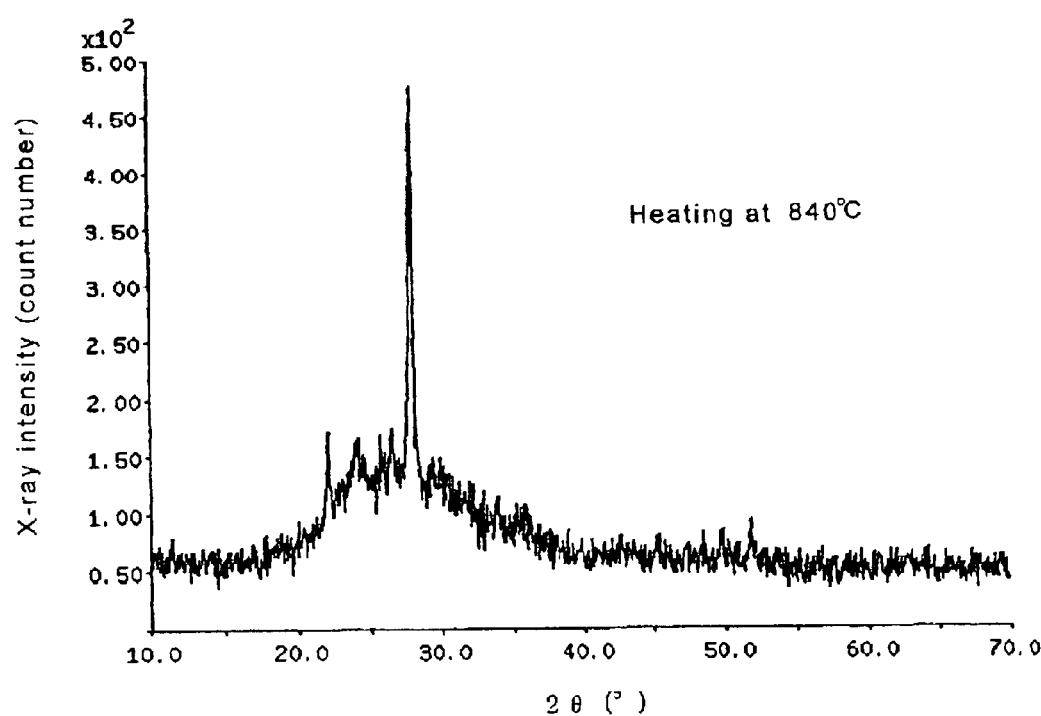
FIG. 5 is a powder X-ray diffraction chart of the glass obtained by heating $CaO$—$Al_2O_3$—$SiO_2$—$B_2O_3$—$ZnO$ amorphous glass at 840° C. for 20 minutes in Example 1.
Figure 6:
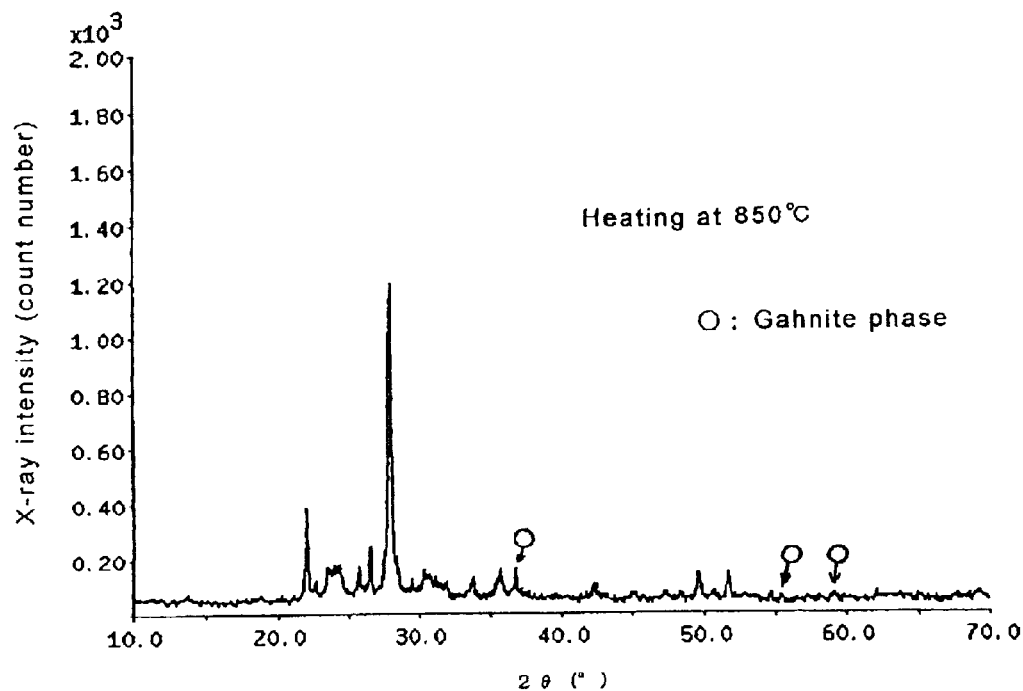
FIG. 6 is a powder X-ray diffraction chart of the glass obtained by heating $CaO$—$Al_2O_3$—$SiO_2$—$B_2O_3$—$ZnO$ amorphous glass at 850° C. for 20 minutes in Example 1.
Figure 7:
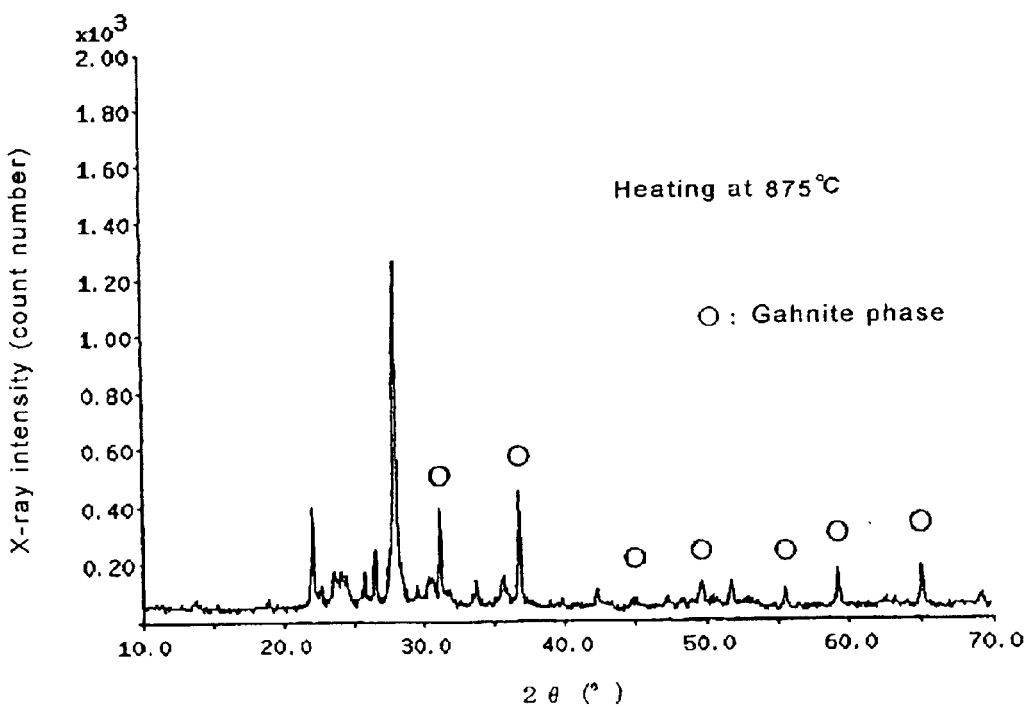
FIG. 7 is a powder X-ray diffraction chart of the glass obtained by heating $CaO$—$Al_2O_3$—$SiO_2$—$B_2O_3$—$ZnO$ amorphous glass at 875° C. for 20 minutes in Example 1.
Figure 8:
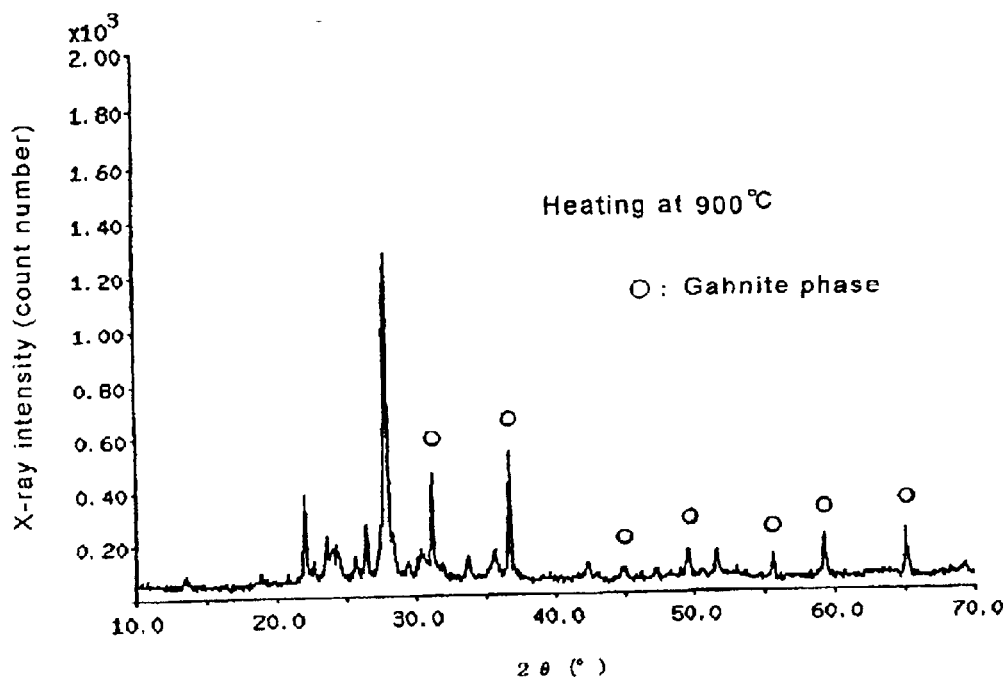
FIG. 8 is a powder X-ray diffraction chart of the glass obtained by heating $CaO$—$Al_2O_3$—$SiO_2$—$B_2O_3$—$ZnO$ amorphous glass at 900° C. for 20 minutes in Example 1.
Figure 9:
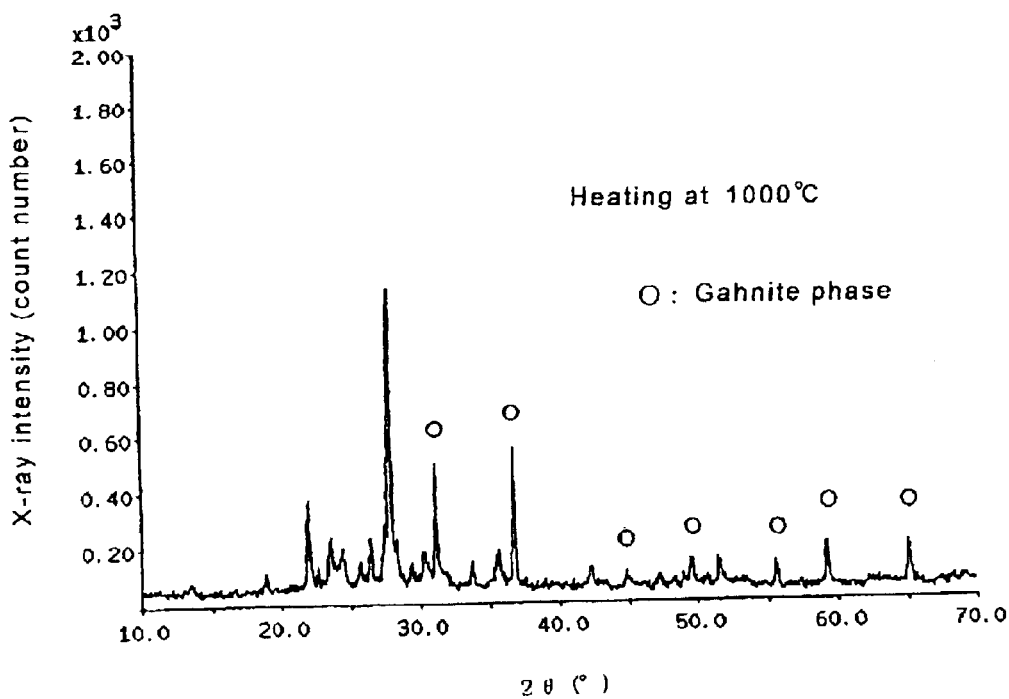
FIG. 9 is a powder X-ray diffraction chart of the glass obtained by heating $CaO$—$Al_2O_3$—$SiO_2$—$B_2O_3$—$ZnO$ amorphous glass at 1000° C. for 20 minutes in Example 1.

The glass was then pulverized in a ball mill to an average particle size of 5 μm, and the resulting powder was heated in an alumina crucibles at a temperature rise rate of 20° C./min, to be maintained at temperatures of 800° C., 830° C., 840° C., 850° C., 875° C., 900° C. and 1000° C., respectively, all for 20 minutes. After cooling, compositions of the heated glass powders were examined by powder X-ray diffraction. The glass heated at 800° C. (FIG. 3) was not crystallized, but in the one heated at 830° C. separation of crystals having the strongest line in the range of 2θ=27.6°–28.2° could be confirmed (FIG. 4). At 840° C., the crystallization progressed (FIG. 5), and at 850° C., separation of crystals having the strongest line in the range of 2θ=36.6°–37.0° was confirmed and at the same time, crystallized amount of the crystals having the strongest line in the range of 2θ=27.6°–28.2° rapidly increased (FIG. 6). FIGS. 7–9 are powder X-ray diffraction charts of the same glass heated at 875° C., 900° C. and 1,000° C., respectively.

Intensities of the strongest line (diffraction lines in the vicinity of 2θ=27.9°–28.0°) were compared to reveal that the extent of crystallization did not appreciably vary among those heated at 850° C., 875° C. and 900° C., and that the crystallization rapidly took place at around 850° C.

Separation of the crystals having the strongest line in the range of 2θ=36.6°–37.0° was not observed under the heating at 830° C. and 840° C., but a small amount of the crystals were observed at 850° C., further crystallization advancing at 875° C.–900° C.

Figure 1:
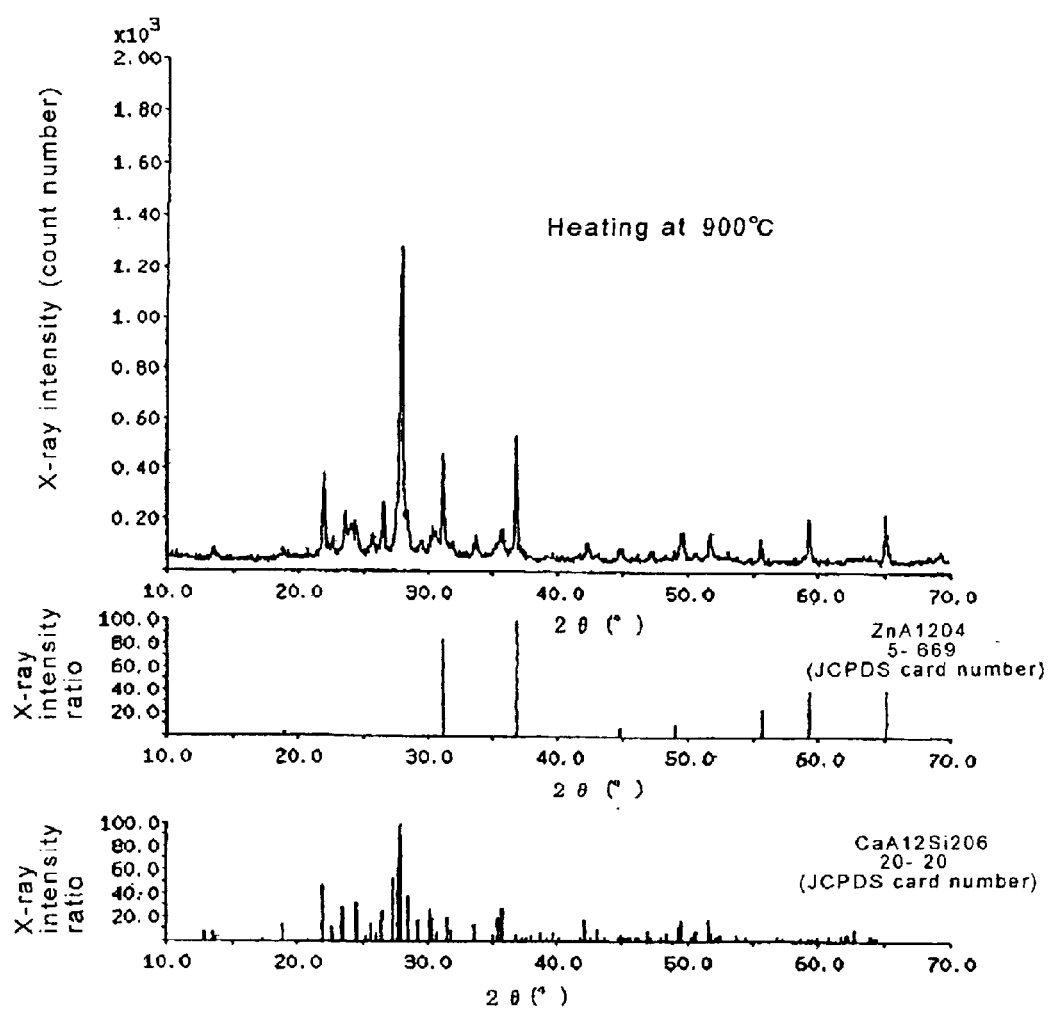
FIG. 1 is a comparison of powder X-ray diffraction chart of the glass obtained by heating CaO—$Al_2O_3$—$SiO_2$—$B_2O_3$—ZnO amorphous glass at 900° C. for 20 minutes in Example 1, with JCPDS cards.

Upon comparing these crystals with JCPDS, the crystals having the strongest line in the range of 2θ=27.6°–28.2° were identified to be anorthite crystals, and those having strongest line in the range of 2θ=36.6°–37.0°, to be gahnite crystals (FIG. 1). Separation of no other crystal was confirmed. In FIGS. 6–9, the peaks attributable to gahnite crystals are marked with circles. All other diffraction peaks are attributable to anorthite crystals.

Diffraction intensity, R and amount of crystallization of each of these glasses in powder X-ray diffraction using CuKα line are shown in Table 1.

According to differential thermal analysis (heating at a temperature rise rate of 20° C./min.), the crystallization ceased at 925° C., which approximately coincides with the results of above X-ray diffraction. The amount of crystals in the crystallized glass under heating at 900° C. was calculated to be 59.36 wt % by the earlier described method, in which anorthite crystals occupied 47.55 wt % and gahnite crystals, 11.81 wt %. The rest was amorphous glass matrix. The amount of crystals in the glass-ceramic heated at 830° C. was calculated to be 2.24 wt % by the earlier described method, which all was attributable to anorthite crystals, the rest being amorphous glass matrix. For all the samples, X-ray diffraction was conducted with PW 1830 model full automatic powder X-ray diffractometer manufactured by Philips Co., using Cu as the anticathode and the Kα line yielded under applied voltage and current of 40 KV and 40 mA. Samples for the X-ray diffraction were powderized and tightly filled in 15×20 mm rectangular depression formed in a glass holder. The given X-ray intensity values are the count numbers obtained by subtracting the count intensity of background of X-ray from directly counted intensity.

Compositions of the amorphous portions were as follows: in the glass-ceramic with crystalline content of 59.36 wt %, CaO: 5.44 wt %, $SiO_2$: 21.45 wt %, $B_2O_3$: 8 wt % and ZnO: 5.76 wt %; and in the glass-ceramic with crystalline content of 2.235 wt %, CaO: 14.55 wt %, $Al_2O_3$: 23.18 wt %, $SiO_2$: 41.04 wt %, $B_2O_3$: 8 wt % and ZnO: 11 wt %.

The glass powder pulverized to an average particle size of 5 μm after the quenching was press-molded under a pressure of 300 kgf/cm$^2$, and the molded body was heated in the air at 900° C. for 20 minutes to provide a glass-ceramic molded body, in three different configurations of 1×1×60 mm square rod, 5×5×50 mm prism and 30 mm in diameter×2 mm in thickness disc. Dielectric constant and direct-current electric resistance at high frequency of those sintered bodies were measured under constant-temperature and constant-humidity conditions of 20° C. and 60 Rh %. The dielectric constant was measured by perturbation method using 1×1×60 mm test specimens, with the results of 6.6 at 1 GHz, 6.7 at 3 GHz and 6.4 at 10 GHz, which were less compared to aluminum nitride sintered body. Thermal expansion coefficient was measured with 5×5×50 mm test specimens, which was $4.8×10^{-6}$/° C. at 100–500° C. Direct-current electric resistance was measured with the disc test specimens, with the result showing high insulation property, as $5.9×10^{15}$ Ω.cm after an applied voltage of 500 V for 1 minute.

Then 10 g of the glass powder which was quenched and pulverized to an average particle size of 5 μm as above was mixed with 4 g of α-terminal as solvent and 0.15 g of ethyl cellulose as binder, to form a paste. This paste was applied onto a surface of 40' 45' 0.635 mm aluminum nitride sintered substrate (Tokuyama Corporation, SH30™) by screen printing method. After drying off, the paste was heated at a temperature rise rate of 20° C./min. and at 900° C. for 20 minutes, either in the air or in $N_2$ atmosphere. The resulting glass had a thickness of 20 μm. In both of the products obtained by sintering in the air or in $N_2$ atmosphere and subsequent quenching, the glass-ceramic and aluminum nitride sintered body were intimately jointed and no crack or peeling was observed. The jointed bodies were not warped. Then sintering was repeated 4 times under identical conditions, but no defect in jointed portions was caused. The sample sintered in $N_2$ atmosphere did not show a tendency for blackening in the glass or swelling or foaming phenomenon.

Using the remainder of the substrate the glass paste on which had been dried, further a copper metal paste containing pure copper powder as its solid component (Kyoto Elex Co., DD 3200A™) was applied on the glass paste in a disc form of 2.5 mm in diameter and 13 μm in thickness by screen printing method and dried. These were sintered at 900° C. for 20 minutes in $N_2$ atmosphere, together with the dry glass paste. The copper paste was converted to sintered copper metal, onto which a 42% Ni—Fe alloy rod of 1.2 mm in diameter was soldered and subjected to 90° perpendicular tensile test. The average of ten measurements at different sites of the copper metal portions was 56 MPa. The minimum value was 29 MPa and the maximum value was 80 MPa. When disruption mode in this strength test was examined, the copper metal portion was broken in low-strength samples. In high-strength samples, either inside of the glass-ceramic or inside of the aluminum nitride sintered body was broken, but at none of the measurement site breakage occurred at around the interface between the glass-ceramic and aluminum nitride sintered body. Thus it was confirmed that the joining or bonding of the glass-ceramic with aluminum nitride sintered body was considerably strong.

Referential Example 1

Figure 10:
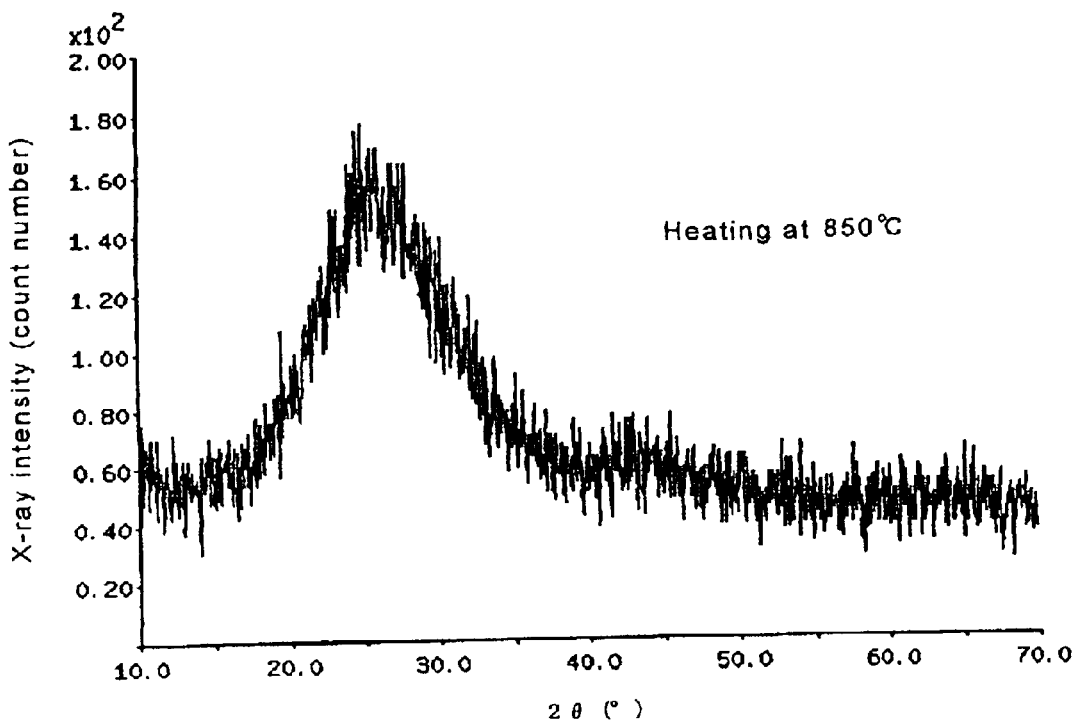
FIG. 10 is a powder X-ray diffraction chart of the glass obtained by heating $CaO$—$Al_2O_3$—$SiO_2$—$B_2O_3$—$MgO$ amorphous glass at 850° C. for 20 minutes in Referential Example 1.
Figure 11:
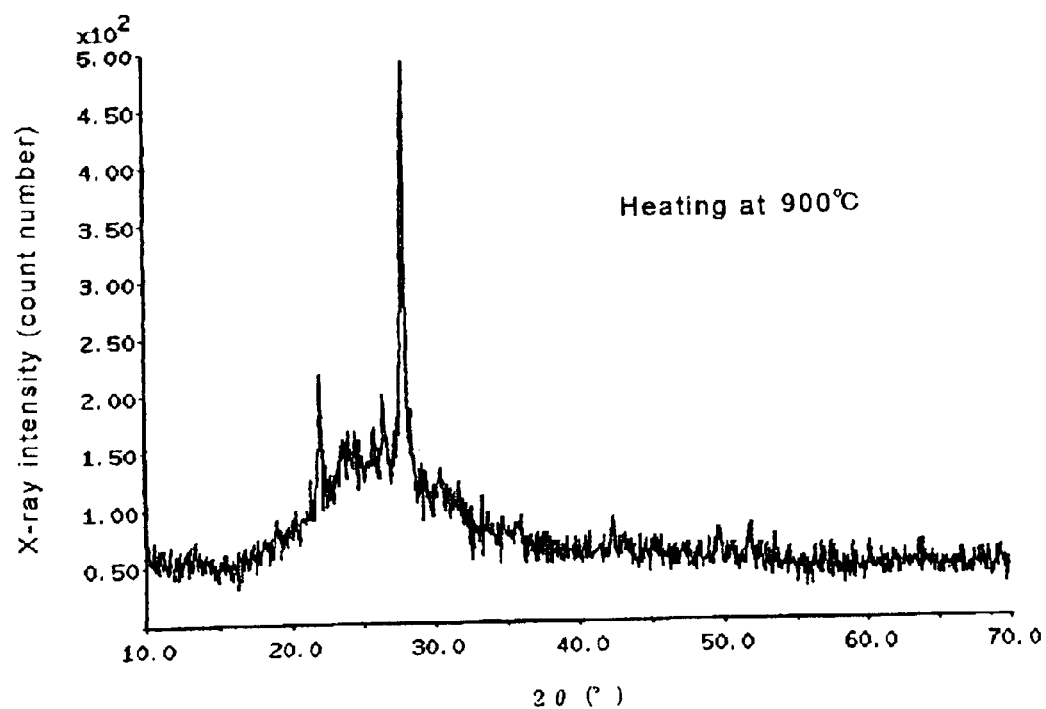
FIG. 11 is a powder X-ray diffraction chart of the glass obtained by heating $CaO$—$Al_2O_3$—$SiO_2$—$B_2O_3$—$MgO$ amorphous glass at 900° C. for 20 minutes in Referential Example 1.
Figure 12:
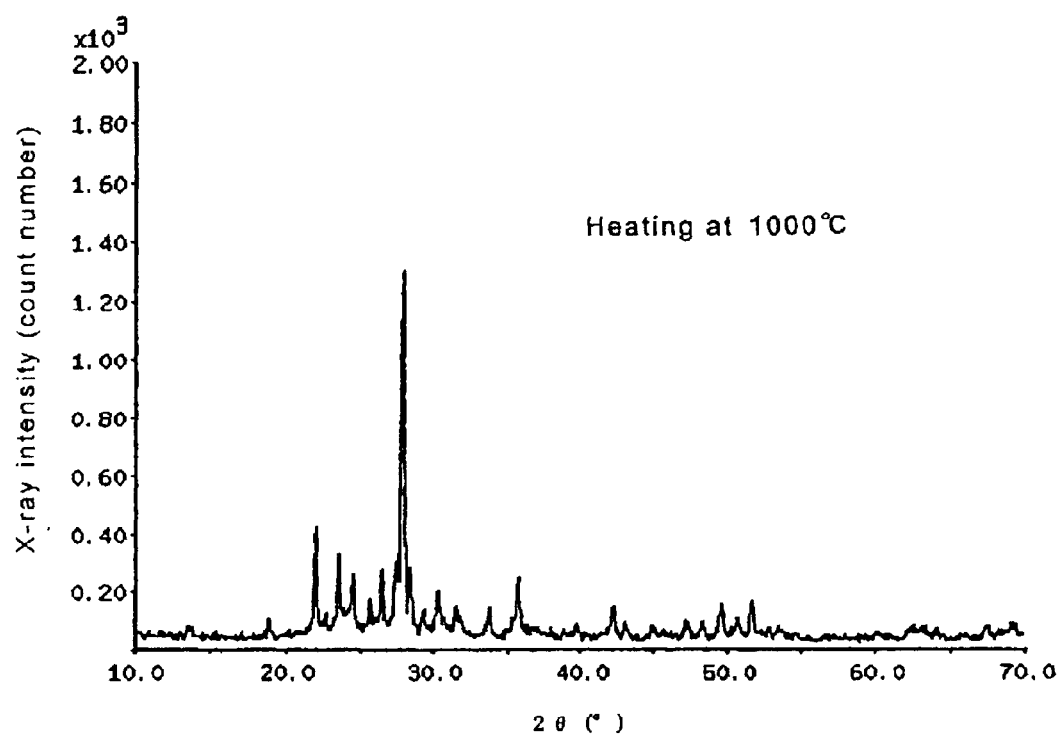
FIG. 12 is a powder X-ray diffraction chart of the glass obtained by heating $CaO$—$Al_2O_3$—$SiO_2$—$B_2O_3$—$MgO$ amorphous glass at 1000° C. for 20 minutes in Referential Example 1.
Figure 13:
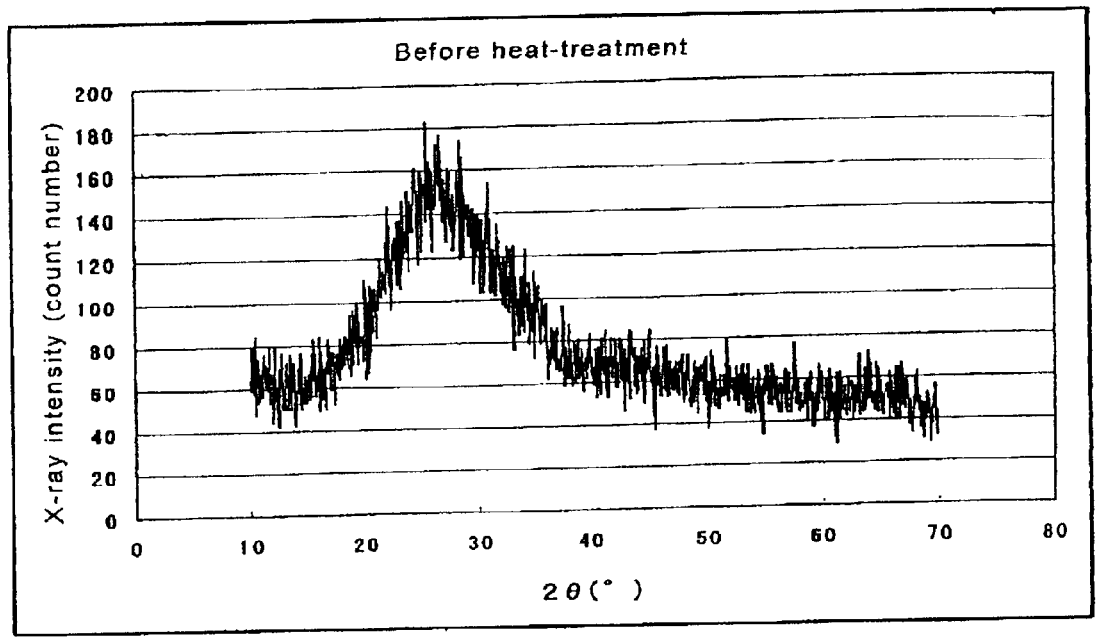
FIG. 13 is a powder X-ray diffraction chart of a $CaO$—$Al_2O_3$—$SiO_2$—$B_2O_3$—$ZnO$ amorphous glass obtained in Example 2.

An amorphous glass having a composition of CaO: 16 wt %, $Al_2O_3$: 27 wt %, $SiO_2$: 44 wt %, $B_2O_3$: 9 wt % and MgO: 4 wt % was prepared similarly to Example 1, and the amorphous glass was heated at the various temperatures of 800° C., 850° C., 900° C. and 1,000° C., for 20 minutes. Their X-ray diffraction patterns after the heating were shown in FIGS. 10–12, respectively.

X-ray intensity values at 2θ=27.6°–28.2° of these heated glasses are shown in Table 1. Crystals separated in this glass were invariably anorthite crystals.

As is clear from Table 1, the glass containing a Zn component of Example 1 separated anorthite crystals at lower temperatures than the glass not containing Zn component used in Referential Example 1. That is, in the glass of Example 1, anorthite crystals started to separate at 830° C., the crystals grew at 840° C. and rapidly increased under heating at 850° C. The crystal amount at 850° C. was nearly the same to that at 1000° C. On the other hand, in the glass of the Referential Example not containing a Zn component, the amount of anorthite crystals under 900° C. heating was equivalent to that under 840° C. in Example 1, the difference being by about 60° C. Taking also into consideration the differential thermal analysis data, where a Zn component was blended, the crystallization temperature was lowered by 25–100° C.

TABLE 1

| | Example 1 | | | | | Example 2 | | | | | Referential Example 1 |
|---|---|---|---|---|---|---|---|---|---|---|---|
| | X-Ray Count Number | | | Amount of Crystals/wt % | | X-Ray Count Number | | | Amount of Crystals/wt % | | X-Ray Count Number |
| Heating Condition | Anorthite | (gahnite) | R | Total crystals | (anorthite crystals) | Anorthite | (gahnite) | R | Total crystals | (anorthite crystals) | anorthite |
| No heating | amorphous | | — | — | | amorphous | | — | — | | amorphous |
| 800° C. × 20 min. | amorphous | | — | — | | amorphous | | — | — | | amorphous |
| 830° C. × 20 min. | 55 | (0) | 0 | 2.235 | (2.235) | — | — | — | — | — | — |
| 840° C. × 20 min. | 346 | (0) | 0 | 14.06 | (14.06) | — | — | — | — | — | — |
| 850° C. × 20 min. | 1116 | (90) | 0.0806 | 47.77 | (45.36) | 76 | (0) | 0 | 3.733 | (3.733) | amorphous |
| 875° C. × 20 min. | 1129 | (357) | 0.3162 | 55.44 | (45.88) | 320 | (0) | 0 | 15.72 | (15.72) | — |
| 900° C. × 20 min. | 1170 | (441) | 0.3769 | 59.36 | (47.55) | 751 | (0) | 0 | 36.89 | (36.89) | 331 |

TABLE 1-continued

| | Example 1 | | | | | Example 2 | | | | | Referential Example 1 X-Ray Count Number anorthite |
|---|---|---|---|---|---|---|---|---|---|---|---|
| | X-Ray Count Number | | | Amount of Crystals/wt % | | X-Ray Count Number | | | Amount of Crystals/wt % | | |
| Heating | | | | Total | (anorthite | | | | Total | (anorthite | |
| Condition | Anorthite | (gahnite) | R | crystals | crystals) | Anorthite | (gahnite) | R | crystals | crystals) | |
| 950° C. × 20 min. | — | — | — | — | — | 740 | (53) | 0.0720 | 38.08 | (36.35) | — |
| 1000° C. × 20 min. | 1037 | (412) | 0.3973 | 53.39 | (42.14) | 999 | (56) | 0.0563 | 50.72 | (49.07) | 1197 |

Example 2

Figure 14:
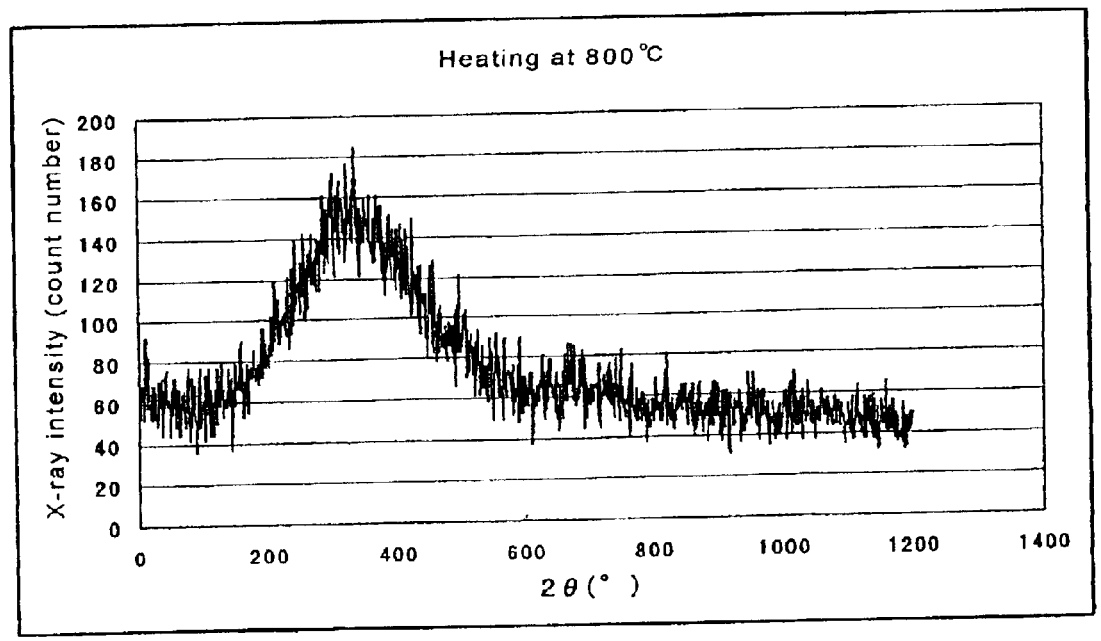
FIG. 14 is a powder X-ray diffraction chart of the glass obtained by heating $CaO$—$Al_2O_3$—$SiO_2$—$B_2O_3$—$ZnO$ amorphous glass at 800° C. for 20 minutes in Example 2.
Figure 15:
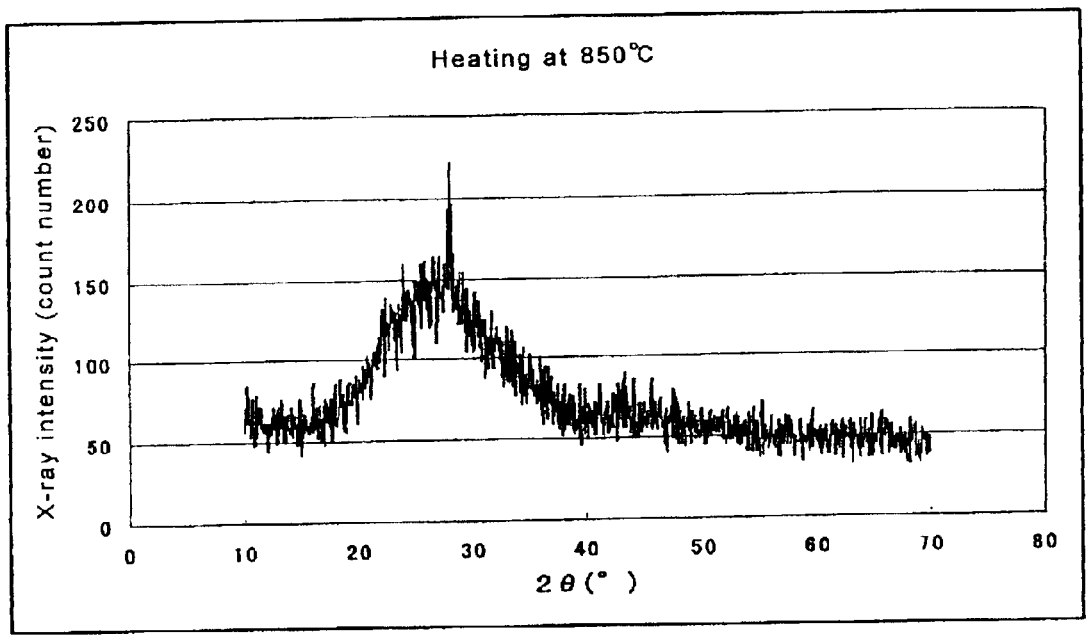
FIG. 15 is a powder X-ray diffraction chart of the glass obtained by heating $CaO$—$Al_2O_3$—$SiO_2$—$B_2O_3$—$ZnO$ amorphous glass at 850° C. for 20 minutes in Example 2.
Figure 16:
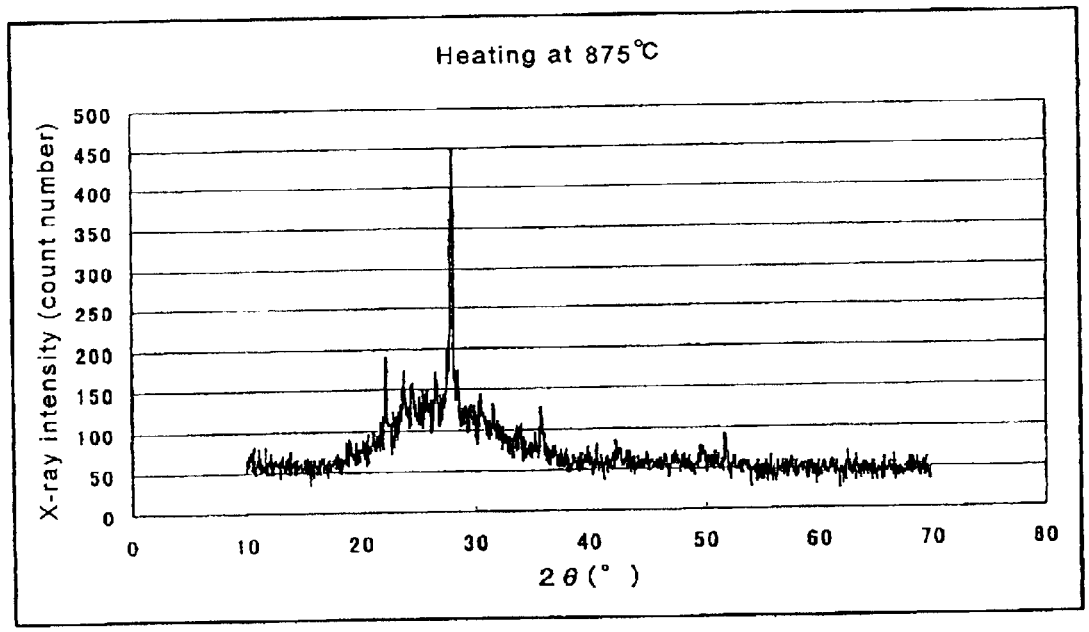
FIG. 16 is a powder X-ray diffraction chart of the glass obtained by heating $CaO$—$Al_2O_3$—$SiO_2$—$B_2O_3$—$ZnO$ amorphous glass at 875° C. for 20 minutes in Example 2.
Figure 17:
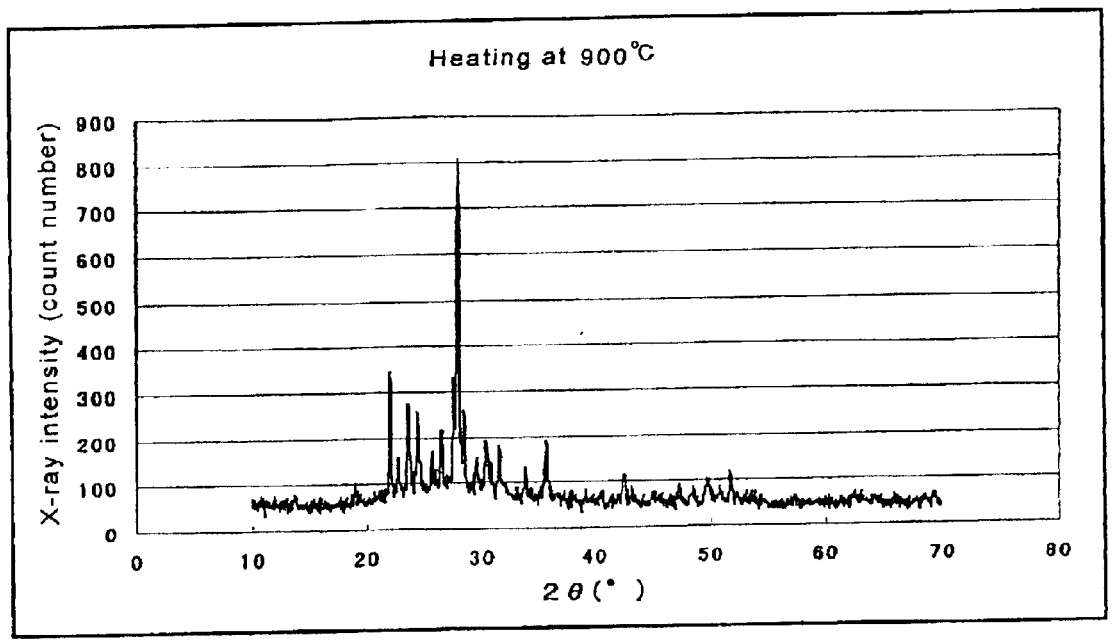
FIG. 17 is a powder X-ray diffraction chart of the glass obtained by heating $CaO$—$Al_2O_3$—$SiO_2$—$B_2O_3$—$ZnO$ amorphous glass at 900° C. for 20 minutes in Example 2.

An amorphous glass having a composition of CaO: 15 wt %, $Al_2O_3$: 19 wt %, $SiO_2$: 42 wt %, $B_2O_3$: 12 wt % and ZnO: 12 wt % was prepared in the manner similar to Example 1, which was maintained at various temperatures of 800° C., 850° C., 875° C., 900° C., 950° C. and 1,000° C., for 20 minutes. The amounts of crystals in the respective glass-ceramics were examined, whereby it could be confirmed that no crystallization occurred at 800° C. (FIG. 14), but at 850° C. anorthite crystals started to separate (FIG. 15). At 875° C. anorthite crystallization progressed (FIG. 16) and at 900° C. the crystallization nearly terminated (FIG. 17). According to differential thermal analysis (heating at a temperature rise rate of 20° C./min.), the crystallization temperature of the glass-ceramic of this Example was 998° C.

Figure 18:
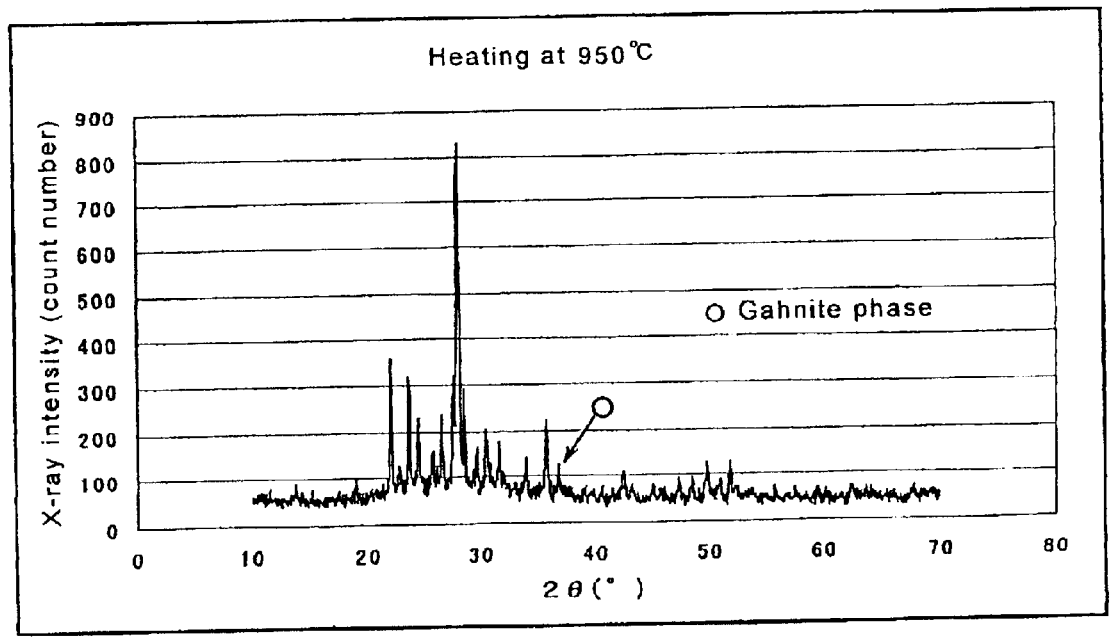
FIG. 18 is a powder X-ray diffraction chart of the glass obtained by heating $CaO$—$Al_2O_3$—$SiO_2$—$B_2O_3$—$ZnO$ amorphous glass at 950° C. for 20 minutes in Example 2.
Figure 19:
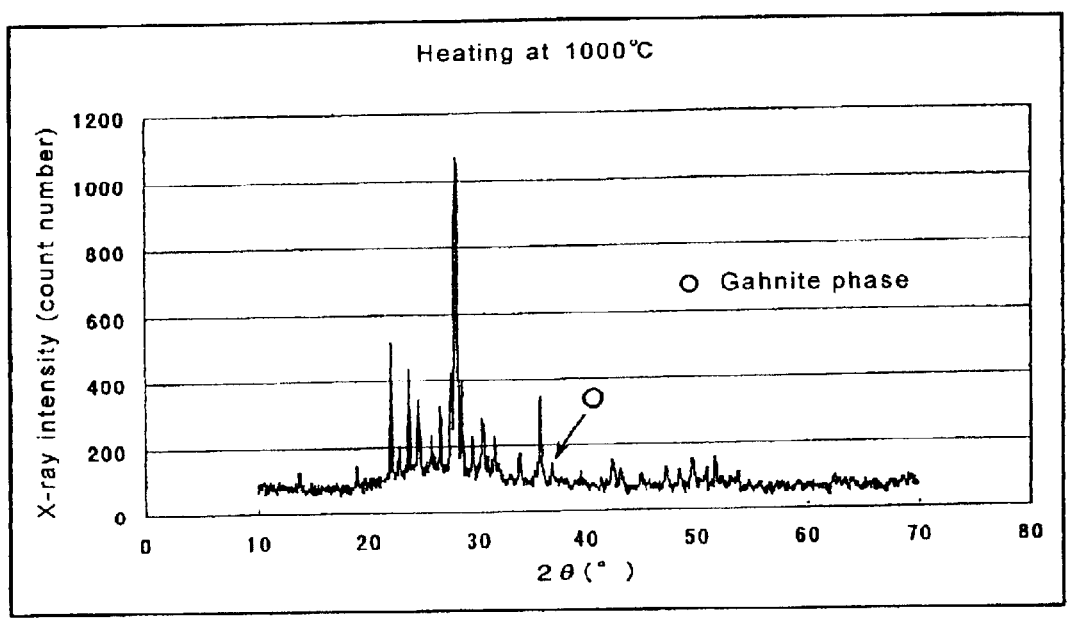
FIG. 19 is a powder X-ray diffraction chart of the glass obtained by heating $CaO$—$Al_2O_3$—$SiO_2$—$B_2O_3$—$ZnO$ amorphous glass at 1000° C. for 20 minutes in Example 2.

On the other hand, no gahnite crystal was observed during the 900° C. heating or at lower temperatures, but at 950° C. a minor separation took place (FIG. 18) and even at 1000° C. its amount did not increase appreciably (FIG. 19).

The amount of crystals in the glass-ceramic after the 1000° C. heating was calculated to be 50.89 wt % by the earlier described method, in which the amount of anorthite crystals was 49.07 wt % and that of gahnite crystals was 1.82 wt %, the rest being amorphous glass matrix. Also the amount of crystals in the glass-ceramic after the 850° C. heating was calculated to be 3.73 wt % by the earlier described method, which all was anorthite crystals. The remaining part was amorphous glass matrix.

The composition of the amorphous portion was: in the glass-ceramic with the crystal content of 50.89 wt %, CaO: 5.11 wt %, $SiO_2$: 20.81 wt %, $B_2O_3$: 12 wt % and ZnO: 11.19 wt %; and with the glass-ceramic with the crystal content of 3.733 wt %, CaO: 14.25 wt %, $Al_2O_3$: 17.63 wt %, $SiO_2$: 40.40 wt %, $B_2O_3$: 12 wt % and ZnO: 12 wt %.

FIG. 13–19 show the powder X-ray diffraction charts at the respective heating temperatures, and Table 1 shows the X-ray intensities and crystal amounts.

The amorphous glass was press-molded at 900° C. similarly to Example 1 to provide a glass-ceramic molded body, and its dielectric constant and direct-current electric resistance were measured. The dielectric constant was 6.5 at 1 GHz, 6.7 at 3 GHz and 6.6 at 10 GHz, which were less than those of aluminum nitride sintered body; and the direct-current electric resistance was $7.7 \times 10^{15}$ Ω.cm, exhibiting high electric insulation. The thermal expansion coefficient at 100–300° C. was $4.5 \times 10^{-6}$/° C., and that at 100–500° C. was $4.9 \times 10^{-6}$/° C.

Then its jointability with aluminum nitride sintered body was examined in the manner similar to Example 1. The results were: in both of the products sintered in the air and in $N_2$ atmosphere the glass-ceramic and aluminum nitride sintered bodies were intimately joined after quenching and no cracking or peeling was observed. The jointed bodies also were not warped. Thereafter the sintering was repeated 4 times under identical conditions, without developing any joining defect. The samples sintered in $N_2$ atmosphere did not show any blackening tendency in the glass-ceramic or swelling or foaming phenomenon. The thickness of the glass layer after sintering was 40 μm.

Jointed bodies were prepared in the identical manner with Example 1, except that the amorphous glass which was formed in this Example and a metallic paste formed of Ag/Pt powder containing 1 wt % of Pt as the solid component (Kyoto Elex Co.) were used, and the products' 90° perpendicular tensile test was conducted. The average of ten measurements at different sites of the metal portion was 54 MPa; the minimum value was 26 MPa and the maximum value was 74 MPa. When disruption mode in this tensile test was examined, the metal portion was broken in low-strength samples. In high-strength samples, either inside of the glass-ceramic or inside of the aluminum nitride sintered body was broken, but at none of the measurement site breakage occurred at around the interface between the glass-ceramic and aluminum nitride sintered body. Thus it was confirmed that the jointing strength of the glass-ceramic with aluminum nitride sintered body was considerably strong.

Referential Example 2

With the view to examine the influence of Pb component content in the glass, an amorphous glass composed of CaO: 15 wt %, $AM_2O_3$: 24 wt %, $SiO_2$: 42 wt %, $B_2O_3$: 7.6 wt %, ZnO: 11 wt %; and PbO: 0.4 wt %; and another amorphous glass composed of CaO: 13 wt %, $Al_2O_3$: 21 wt %, $SiO_2$: 38 wt %, $B_2O_3$: 7.1 wt %, ZnO: 10 wt % and PbO: 10. 9 wt % were prepared, which were joined with aluminum nitride sintered body by the method similar to that used in Example 1.

The glass which contained 0.4 wt % of PbO could be jointed with aluminum nitride sintered body without any problem, while in the glass containing 10.9 wt % of PbO a large extent of swelling and foaming occurred in the glass, and when the jointed portion was touched with forceps, the glass-ceramic and aluminum nitride sintered body readily separated.

Referential Example 3

For examining the influence of Ti component and Zr component contents in the glass, an amorphous glass composed of CaO: 19 mass %, $Al_2O_3$: 20 mass %, $SiO_2$: 32 mass %, $B_2O_3$: 9 mass % and $TiO_2$: 20 mass %; and another amorphous glass composed of CaO: 19 mass %, $Al_2O_3$: 11 mass %, $SiO_2$: 27 mass %, $B_2O_3$: 8 mass %, $ZrO_2$: 10 mass % and $TiO_2$: 25 mass % were prepared, which were heated at 900° C. for 20 minutes to be converted to glass-ceramics. The glass containing 20 mass % of $TiO_2$ had a thermal expansion coefficient of $5.8\times10^{-6}/°$ C., and the glass containing 35 mass % in total of $TiO_2$ plus $ZrO_2$ had that of $6.2\times10^{-6}/°$ C., the values considerably higher than the thermal expansion coefficient, $4.5\times10^{-6}/°$ C., of aluminum nitride sintered body.

Example 3

A 40×45×0.635 mm aluminum nitride sintered substrate (Tokuyama Corporation, SH 30™) with an open through-hole of 0.4 mm in diameter from the front to the back of the substrate was prepared. A commercially available copper-containing paste (Kyoto Elex Co., DD3200B™) was adjusted to a low viscosity with α-terpineol, and applied to said through-hole and dried. This through-hole and the conductor formed thereon correspond to the via 6 for conductivity formed in aluminum nitride substrate 2 in FIG. 20. Further on the top and bottom surfaces of the substrate, prescribed electric circuits were applied with a paste of which viscosity was not adjusted, by means of screen printing and dried. These electric circuits correspond to wiring conductors 3 on aluminum nitride sintered substrate shown in FIG. 20. The aluminum nitride sintered substrate on which the conductor paste was printed and dried was sintered in $N_2$ atmosphere at 900° C. for 20 minutes.

Figure 20:
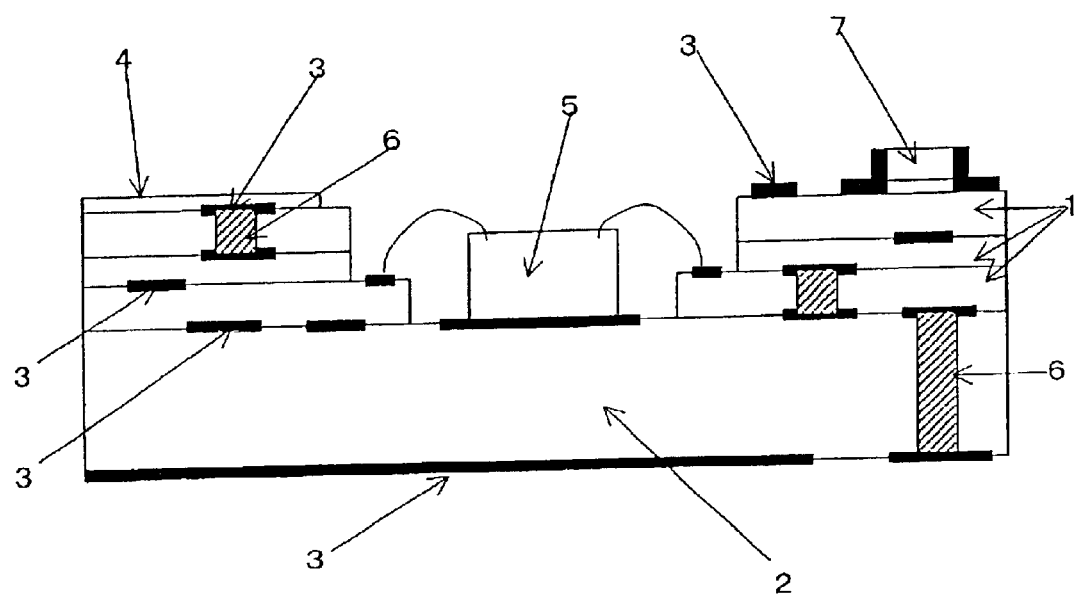
FIG. 20 is a type diagram of an example of jointed body formed of glass-ceramic and aluminum nitride sintered body.

The Cu conductors on the aluminum nitride sintered substrate surfaces after the sintering had a thickness of 13 μm. On the sintered substrate surface, the glass paste which was prepared in Example 1 was applied by screen printing method, dried and sintered in $N_2$ atmosphere at 900° C. for 20 minutes. Onto the glass after the sintering, further the glass paste was screen printed in the identical pattern and dried, on which a prescribed electric circuit was screen printed using said Cu paste and dried, followed by a sintering in $N_2$ atmosphere at 900° C. for 20 minutes. The glass layers applied two times separately each had a thickness of 40 μm after the sintering. In this operation, a cavity was formed at prescribed position at the time of glass paste printing, and by filling the cavity with the Cu paste and sintering, a continuous via for conductivity was formed in the formed glass. Repeating similar procedures, an electric circuit as illustrated by FIG. 20 in which a three-layered glass layer was formed, was obtained.

If necessary an over-glass 4 or Au plating is applied on the Cu conductor portion on the surface of this circuit substrate. Then a semiconductor chip 5 was mounted, and the semiconductor chip and the circuit substrate were electrically connected by wire bonding or like means. Further, if necessary chip parts 7 such as a condenser, resistor and the like may optionally be mounted.

Example 4

An aluminum nitride sintered circuit on which conductor paste was printed, dried and sintered was obtained in the manner similar to Example 3, except that the sintering time was 10 minutes.

Onto the surface of the sintered substrate, a glass paste prepared from the amorphous glass of Referential Example 1 was applied by screen printing method, dried and sintered in $N_2$ atmosphere at 900° C. for 10 minutes. Further on the sintered glass surface, the glass paste was screen printed in the identical pattern and dried, and a prescribed electric circuit was screen printed thereon using said Cu paste and dried, followed by sintering in $N_2$ atmosphere at 900° C. for 10 minutes. The glass layers applied two times separately each had a thickness of 40 μm. In this operation, a cavity was formed at prescribed position at the time of glass paste printing, and by filling the cavity with the Cu paste and sintering, a via for conductivity was formed in the formed glass layer. Repeating similar procedures, a circuit substrate as illustrated by FIG. 20 in which a three-layered glass layer was formed, was obtained.

What is claimed is:

1. A joined body of glass-ceramic consisting of crystalline portion and amorphous portion with aluminum nitride sintered body, which is characterized in that said crystalline portion is composed mainly of crystals having the strongest line in a range of $2\theta=27.6°-28.2°$ in powder X-ray diffraction using CuKα line, and said glass-ceramic has a composition containing 0.5–30% by weight of Zn component in terms of oxide, not more than 10% by weight in total of Ti component and Zr component in terms of respective oxides and not more than 5% by weight of Pb component in terms of oxide.

2. A joined body according to claim 1, in which the glass-ceramic has a composition formed of:

CaO: 5–25% by weight,
$Al_2O_3$: 15–40% by weight,
$SiO_2$: 25–60% by weight,
ZnO: 0.5–30% by weight,
$B_2O_3$: 0.05–20% by weight,
$TiO_2+ZrO_2$: 0–5% by weight,
PbO: 0–5% by weight, and
other metal oxide or oxides: 0–7% by weight in terms of corresponding oxides (provided that the sum of above components is 100% by weight).

3. A jointed body according to claim 1, in which the glass-ceramic has a composition formed of:

CaO: 8–25% by weight,
$Al_2O_3$: 15–35% by weight,
$SiO_2$: 33–55% by weight,
ZnO: 0.5–25% by weight and
$B_2O_3$: 0.05–18% by weight, in terms of corresponding oxides (provided that the sum of above components is 100% by weight).

4. A joined body according to claim 1, which is characterized in that the crystals having the strongest line in a range of $2\theta=27.6°-28.2°$ in powder X-ray diffraction using CuKα line are anorthite crystals.

5. A joined body according to claim 1, in which the crystals contained in the crystalline portion of glass-ceramic comprise those having the strongest line in a range of $2\theta=27.6°-28.2°$ in powder X-ray diffraction using CuKα line and those having the strongest line in a range of $2\theta=36.6°-37.0°$ in powder X-ray diffraction using CuKα line.

6. A joined body according to claim 5, in which the crystals having the strongest line in a range of $2\theta=27.6°-28.2°$ in powder X-ray diffraction using CuKα line are anorthite crystals and those having the strongest line in a range of $2\theta=36.6°-37.0°$ in powder X-ray diffraction using CuKα line are gahnite crystals.

7. An electric circuit substrate made of a joined body formed by joining glass-ceramic consisting of crystalline portion and amorphous portion with aluminum nitride sintered body, in which the crystalline portion is composed mainly of crystals having the strongest line in a range of $2\theta=27.6°-28.2°$ in powder X-ray diffraction using CuKα line, and said glass-ceramic has a composition containing 0.5–30% by weight of Zn component in terms of oxide, not more than 10% by weight in total of Ti component and Zr component in terms of respective oxides and not more than 5% by weight of Pb component in terms of oxide.

8. An electric circuit substrate in which an electric circuit or circuits are formed in at least one surface or inside of the glass-ceramic or on surface of the aluminum nitride sintered body, in a joined body as described in claim 1.

9. A method of preparing a joined body of glass-ceramic with aluminum nitride sintered body, which is characterized by forming a glass layer on an aluminum nitride sintered body, said glass layer containing a substantially amorphous glass having a composition containing 0.5–30% by weight of Zn component in terms of oxide, not more than 10% by weight in total of Ti component and Zr component in terms of respective oxides and not more than 5% by weight of Pb component in terms of oxide;

joining said glass layer with the aluminum nitride sintered body by heating them to a temperature not lower than the softening point of the amorphous glass, and separating crystals having the strongest line in a range of $2\theta=27.6°-28.2°$ in powder X-ray diffraction using CuKα line in said glass by said heating.

10. A preparation method according to claim 9, wherein the amorphous glass has a composition formed of:

CaO: 5–25% by weight,
$Al_2O_3$: 15–40% by weight,
$SiO_2$: 25–60% by weight,
ZnO: 0.5–30% by weight,
$B_2O_3$: 0.05–20% by weight,
$TiO_2+ZrO_2$: 0–5% by weight,
PbO: 0–5% by weight, and
other metal oxide or oxides: 0–7% by weight
in terms of corresponding oxides (provided that the sum of above components is 100% by weight).

11. A preparation method according to claim 9, wherein the amorphous glass has a composition formed of:

CaO: 8–25% by weight,
$Al_2O_3$: 15–35% by weight,
$SiO_2$: 33–55% by weight,
ZnO: 0.5–25% by weight and
$B_2O_3$: 0.05–18% by weight,
in terms of corresponding oxides (provided that the sum of above components is 100% by weight).

12. A preparation method according to claim 9, which is characterized by separating crystals having the strongest line in a range of $2\theta=27.6°-28.2°$ in powder X-ray diffraction using CuKα line and crystals having the strongest line in a range of $2\theta=36.6°-37.0°$ in powder X-ray diffraction using CuKα line.

13. A method of preparing a joined body of glass-ceramic on which an electric circuit or circuits are formed, with aluminum nitride sintered body, which is characterized by forming a glass layer on an aluminum nitride sintered body, said glass layer containing a substantially amorphous glass which is capable of crystallizing under heating, the crystals having the strongest line in a range of $2\theta=27.6°-28.2°$ in powder X-ray diffraction using CuKα line and containing not more than 10% by weight in total of Ti component and Zr component in terms of corresponding oxides and not more than 5% by weight of Pb component in terms of oxide, also forming a substance which is capable of forming an electric circuit layer under heating, on said glass layer and/or on the aluminum nitride sintered body, and thereafter heating the system at temperatures of 600–1100° C., whereby mutually joining the layers of the glass, aluminum nitride sintered body and electric circuit and separating said crystals in the glass layer to convert it glass-ceramic.

14. A preparation method according to claim 13, in which crystals having the strongest line in a range of $2\theta=27.6°-28.2°$ in powder X-ray diffraction using CuKα line and crystals having the strongest line in a range of $2\theta=36.6°-37.0°$ in powder X-ray diffraction using CuKα line are separated in the occasion of heating.

15. A preparation method according to claim 13, in which the heating temperature is 800–970° C.

16. A joined body according to claim 2, which is characterized in that the crystals having the strongest line in a range of $2\theta=27.6°-28.2°$ in powder X-ray diffraction using CuKα line are anorthite crystals.

17. A joined body according to claim 3, which is characterized in that the crystals having the strongest line in a range of $2\theta=27.6°-28.2°$ in powder X-ray diffraction using CuKα line are anorthite crystals.

18. A joined body according to claim 2, in which the crystals contained in the crystalline portion of glass-ceramic comprise those having the strongest line in a range of $2\theta=27.6°-28.2°$ in powder X-ray diffraction using CuKα line and those having the strongest line in a range of $2\Theta=36.6°-37.0°$ in powder X-ray diffraction using CuKα line.

19. A joined body according to claim 3, in which the crystals contained in the of glass-ceramic comprise those having the strongest line in a range of $2\Theta=27.6°-28.2°$ in powder X-ray diffraction using CuKα line and those having the strongest line in a range of $2\theta=36.6°-37.0°$ in powder X-ray diffraction using CuKα line.

20. An electric circuit substrate in which an electric circuit or circuits are formed in at least one surface or inside of the glass-ceramic or on surface of the aluminum nitride sintered body, in a joined body as described in claim 2.

21. An electric circuit substrate in which an electric circuit or circuits are formed in at least one surface or inside of the glass-ceramic or on surface of the aluminum nitride sintered body, in a joined body as described in claim 3.

22. An electric circuit substrate in which an electric circuit or circuits are formed in at least one surface or inside of the glass-ceramic or on surface of the aluminum nitride sintered body, in a joined body as described in claim 4.

23. An electric circuit substrate in which an electric circuit or circuits are formed in at least one surface or inside of the glass-ceramic or on surface of the aluminum nitride sintered body, in a joined body as described in claim 5.

24. An electric circuit substrate in which an electric circuit or circuits are formed in at least one surface or inside of the glass-ceramic or on surface of the aluminum nitride sintered body, in a joined body as described in claim 6.

25. A preparation method according to claim 10, which is characterized by separating crystals having the strongest line in a range of $2\theta=27.6°-28.2°$ in powder X-ray diffraction using CuKα line and crystals having the strongest line in a range of $2\theta=36.6°-37.0°$ in powder X-ray diffraction using CuKα line.

26. A preparation method according to claim 11, which is characterized by separating crystals having the strongest line in a range of $2\theta=27.6°-28.2°$ in powder X-ray diffraction using CuKα line and crystals having the strongest line in a range of $2\theta=36.6°-37.0°$ in powder X-ray diffraction using CuKα line.

27. A preparation method according to claim 14, in which the heating temperature is 800–970° C.

* * * * *